United States Patent
Aoki et al.

(10) Patent No.: US 9,065,438 B2
(45) Date of Patent: Jun. 23, 2015

(54) PROGRAMMABLE LOGIC DEVICE

(71) Applicant: Semiconductor Energy Laboratory Co., Ltd., Atsugi-shi, Kanagawa-ken (JP)

(72) Inventors: Takeshi Aoki, Kanagawa (JP);
Yoshiyuki Kurokawa, Kanagawa (JP);
Munehiro Kozuma, Kanagawa (JP);
Takashi Nakagawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/305,434

(22) Filed: Jun. 16, 2014

(65) Prior Publication Data

US 2014/0368235 A1 Dec. 18, 2014

(30) Foreign Application Priority Data

Jun. 18, 2013 (JP) .................. 2013-127859

(51) Int. Cl.
*H03K 19/0185* (2006.01)
*H03K 19/00* (2006.01)

(52) U.S. Cl.
CPC .... *H03K 19/0013* (2013.01); *H03K 19/018585* (2013.01)

(58) Field of Classification Search
CPC .................. H03K 19/0013; H03K 19/018585
USPC .............................................. 326/38, 41, 46
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,127,702 | A | 10/2000 | Yamazaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Don Le
(74) *Attorney, Agent, or Firm* — Fish & Richardson P.C.

(57) ABSTRACT

Data of a register in a programmable logic element is retained. A volatile storage circuit and a nonvolatile storage circuit are provided in a register of a programmable logic element whose function can be changed in response to a plurality of context signals. The nonvolatile storage circuit includes nonvolatile storage portions for storing data in the register. The number of nonvolatile storage portions corresponds to the number of context signals. With such a structure, the function can be changed each time context signals are switched and data in the register that is changed when the function is changed can be backed up to the nonvolatile storage portion in each function. In addition, the function can be changed each time context signals are switched and the data in the register that is backed up when the function is changed can be recovered to the volatile storage circuit.

20 Claims, 18 Drawing Sheets

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,550,994 | B1* | 6/2009 | Camarota et al. ............... 326/38 |
| 7,674,650 | B2 | 3/2010 | Akimoto et al. |
| 7,732,819 | B2 | 6/2010 | Akimoto et al. |
| 7,944,765 | B1* | 5/2011 | Han et al. ...................... 365/201 |
| 8,675,382 | B2 | 3/2014 | Kurokawa |
| 8,850,108 | B1* | 9/2014 | Hayes et al. .................. 711/103 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0148171 | A1 | 6/2010 | Hayashi et al. |
| 2013/0207170 | A1 | 8/2013 | Kurokawa |
| 2013/0285697 | A1 | 10/2013 | Kurokawa |
| 2013/0286757 | A1 | 10/2013 | Takemura |
| 2013/0314124 | A1 | 11/2013 | Ikeda et al. |
| 2013/0321025 | A1 | 12/2013 | Kurokawa et al. |
| 2014/0126271 | A1* | 5/2014 | Aoki et al. ..................... 365/149 |
| 2014/0269013 | A1* | 9/2014 | Tsutsui et al. ................. 365/149 |
| 2014/0286076 | A1* | 9/2014 | Aoki et al. ..................... 365/72 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure For Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

(56) References Cited

OTHER PUBLICATIONS

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs with a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Tehcnical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th Internaitonal Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review letters), Jul. 31, 2000, vol. 85, No. 5, pp. 1012-1015.

Ishii.T et al., "A Poly-Silicon TFT With a Sub-5-nm Thick Channel for Low-Power Gain Cell Memory in Mobile Applications", IEEE Transactons on Electron Devices, Nov. 1, 2004, vol. 51, No. 11, pp. 1805-1810.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Chun.K et al., "A 3T Gain Cell Embedded DRAM Utilizing Preferential Boosting for High Density and Low Power On-Die Caches", IEEE Journal of Solid-State Circuits, Jun. 1, 2011, vol. 46, No. 6, pp. 1495-1505.

Eslami.F et al., "Capacitive Boosting for FPGA Interconnection Networks", 21st International Conference on Field Programmable Logic and Applications, 2011, vol. 21, pp. 453-458.

Trimberger.S et al., "A Time-Multiplexed FPGA", FCCM 1997 (IEEE 5th Annual International Symposium on Field-Programmable Custom Computing Machines), Apr. 16, 1997, pp. 22-28.

Suzuki.D et al., "Design of a Process-Variation-Aware Nonvolatile MTJ-Based Lookup-Table Circuit", SSDM 2010 (Extended Abstracts of the 2010 International Conference on Solid State Devices and Materials), Sep. 22, 2010, pp. 1146-1147.

Suzuki.D et al., "Fabrication of a Nonvolatile Lookup-Table Circuit Chip Using Magneto/Semiconductor-Hybrid Structure for an Immediate-Power-Up Field Programmable Gate Array", 2009 Symposium on VLSI Circuits Digest of Technical Papers, Jun. 16, 2009, pp. 80-81.

Rahman.A et al., "Determination of Power Gating Granularity for FPGA Fabric", CICC 2006 :IEEE 2006 Custom Integrated Circuits Conference, Sep. 10, 2006, pp. 9-12. IEEE.

\* cited by examiner

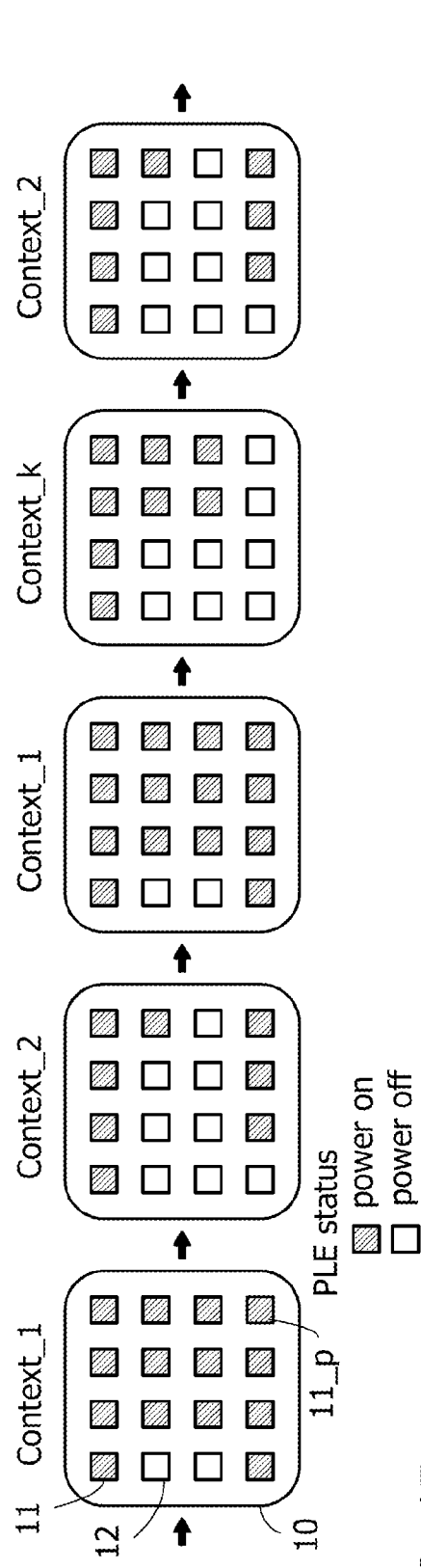
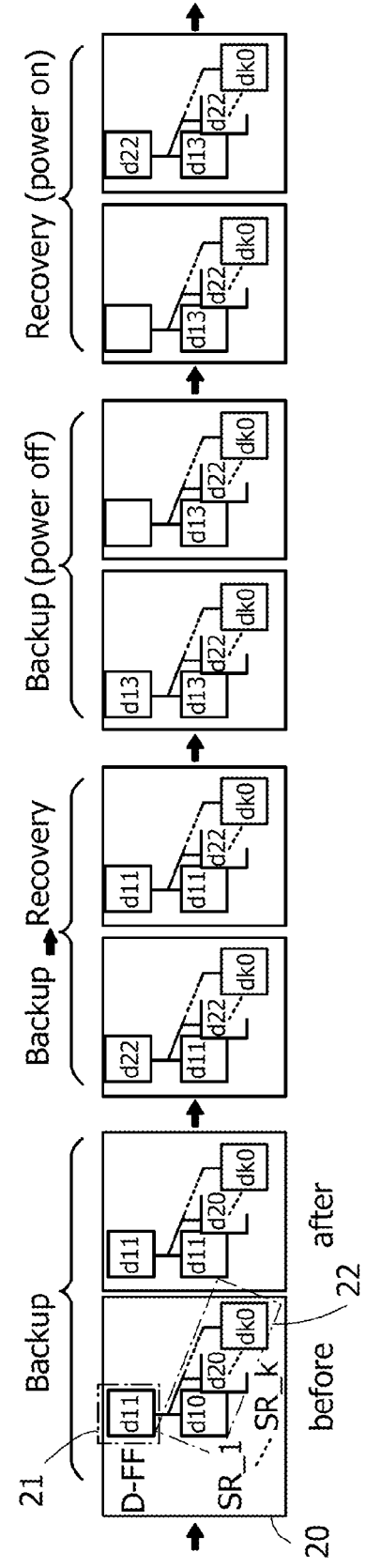
FIG. 1A
FIG. 1B

PROGRAMMABLE LOGIC DEVICE

BACKGROUND OF THE INVENTION

1. Field of the Invention

The present invention relates to programmable logic devices. Furthermore, one embodiment of the present invention relates to semiconductor devices and the like including the programmable logic devices.

2. Description of the Related Art

A programmable logic device (PLD) includes a plurality of programmable logic elements and a plurality of programmable switch elements. The circuit structure and function of the PLD can be changed by changing the function of each programmable logic element or connection between programmable logic elements that is established with programmable switch elements by programming performed by a user after manufacture.

A multi-context PLD that stores a set of configuration data corresponding to a plurality of circuit structures and changes its circuit structure by selecting the set of configuration data to be used has been actively studied (for example, see Non-Patent Document 1). In particular, a fine-grained multi-context PLD has been actively studied because it has high flexibility in changing its circuit structure.

Since widely available configuration memories including static random access memories (SRAM) are volatile, in the case where the configuration memories are restarted after power supply is stopped, it is always necessary to store configuration data again in the configuration memories from external flash memories for storing the configuration data, i.e., to perform reconfiguration. Thus, in the case of portable devices and the like in which power supply is stopped frequently to reduce power consumption, it takes time to restart the configuration memories. To prevent such inconvenience, PLDs that include flash memories or magnetoresistive random access memories (MRAM) have been proposed in which configuration memories are made nonvolatile (for example, see Non-Patent Document 2 and Non-Patent Document 3).

In addition, it is difficult to increase the integration degree of configuration memories using SRAMs and power required for data retention is high. Thus, a report says that a coarse-grained multi-context PLD with a comparatively small number of configuration memories is favorable (for example, see Non-Patent Document 4).

REFERENCE

Non-Patent Document 1: S. Trimberger et al., "A Time-Multiplexed FPGA," *Proc. IEEE FCCM*, 1997, pp. 22-28.
Non-Patent Document 2: D. Suzuki et al., "Design of a Process-Variation-Aware Nonvolatile MTJ-Based Lookup-Table Circuit," *Int. Conf. on Solid-State Devices and Materials,* 2010, pp. 1146-1147.
Non-Patent Document 3: D. Suzuki et al., "Fabrication of a Nonvolatile Lookup-Table Circuit Chip Using Magneto/Semiconductor-Hybrid Structure for an Immediate-Power-Up Field Programmable Gate Array," *Proc. VLSI Circuits Symp.,* 2009, pp. 80-81.
Non-Patent Document 4: A. Rahman et al., "Determination of Power Gating Granularity for FPGA Fabric," *Proc. IEEE CICC,* 2006, pp. 9-12.

SUMMARY OF THE INVENTION

In the case where operation of stopping supply of power to a programmable logic element that is unnecessary for processing, i.e., 'power gating (PG)' is employed to reduce power consumption, it is difficult for a coarse-grained multi-context PLD to control power precisely because a control unit is large.

In contrast, a fine-grained multi-context PLD can control power precisely by power gating in each programmable logic element. However, a control logic is complex when the fine-grained multi-context PLD controls power in each programmable logic element.

In addition, a fine-grained multi-context PLD including an SRAM loses data stored in a register in a programmable logic element by power gating. Thus, it is necessary to retain the data stored in the register in context switch.

In view of the foregoing problems, it is an object of one embodiment of the present invention to provide a programmable logic device with a novel structure, i.e., a fine-grained multi-context PLD that can retain data of a register in a programmable logic element. It is an object of one embodiment of the present invention to provide a programmable logic device with a novel structure, i.e., a fine-grained multi-context PLD that can control power precisely by power gating in each programmable logic element without the use of a complex control circuit.

Note that the description of these objects does not impede the existence of other objects. In one embodiment of the present invention, there is no need to achieve all the objects. Other objects will be apparent from and can be derived from the description of the specification, the drawings, the claims, and the like.

According to one embodiment of the present invention, a volatile storage circuit and a nonvolatile storage circuit are provided in a register of a programmable logic element whose function can be changed in response to a plurality of context signals. The nonvolatile storage circuit includes nonvolatile storage portions for storing data in the register. The number of nonvolatile storage portions corresponds to the number of context signals.

With such a structure, the function can be changed each time context signals are switched and data in the register that is changed when the function is changed can be backed up to the nonvolatile storage portion in each function. In addition, the function can be changed each time context signals are switched and the data in the register that is backed up when the function is changed can be recovered to the volatile storage circuit.

According to one embodiment of the present invention, a switch for controlling power in each programmable logic element is provided in addition to the above structure. Furthermore, data on whether to turn on or off a switch is allocated to configuration data stored in a configuration memory, and the on or off state of the switch is controlled when the function is changed in response to a plurality of context signals.

With such a structure, it is possible to control power in each programmable logic element by controlling configuration data stored in advance and context signals.

One embodiment of the present invention is a programmable logic device that includes a programmable logic element including a register. The programmable logic element is an element whose function can be changed in response to any one of first to k-th context signals (k is a natural number of 2 or more). The register includes a volatile storage circuit and a nonvolatile storage circuit that store data in response to the first to k-th context signals. The nonvolatile storage circuit includes first to k-th nonvolatile storage portions.

One embodiment of the present invention is a programmable logic device that includes a programmable logic element including a register. The programmable logic element is an element whose function can be changed in response to any one of first to k-th context signals (k is a natural number of 2 or more). The register includes a volatile storage circuit and a nonvolatile storage circuit that store data in response to the first to k-th context signals. The nonvolatile storage circuit includes first to j-th nonvolatile storage portions (j is a natural number of 2 or more and k or less). The first to j-th nonvolatile storage portions are storage portions in which data stored in the volatile storage circuit is backed up and stored when the first to k-th context signals are switched and the data backed up is recovered to the volatile storage circuit.

One embodiment of the present invention is a programmable logic device that includes a plurality of programmable logic elements each including a register and a switch for controlling supply of power to the register. The programmable logic element is an element whose function can be changed in response to any one of first to k-th context signals (k is a natural number of 2 or more). The register includes a volatile storage circuit and a nonvolatile storage circuit that store data in response to the first to k-th context signals. The nonvolatile storage circuit includes first to j-th nonvolatile storage portions (j is a natural number of 2 or more and k or less). The first to j-th nonvolatile storage portions are storage portions in which data stored in the volatile storage circuit is backed up and stored when the first to k-th context signals are switched and the data backed up is recovered to the volatile storage circuit. In a period during which the data stored in the volatile storage circuit is backed up to the first to j-th nonvolatile storage portions and is not recovered to the volatile storage circuit, the switch is turned off.

One embodiment of the present invention is a programmable logic device that includes a plurality of programmable logic elements each including a register, a configuration memory, and a switch for controlling supply of power to the register. The register includes a volatile storage circuit and a nonvolatile storage circuit that store data in response to first to k-th context signals (k is a natural number of 2 or more). The configuration memory is an element whose function can be changed in response to any one of first to k-th configuration data. The switch is turned off in accordance with a function allocated to the first to k-th configuration data in response to any one of the first to k-th context signals. The nonvolatile storage circuit includes first to j-th nonvolatile storage portions (j is a natural number of 2 or more and k or less). The first to j-th nonvolatile storage portions are storage portions in which data stored in the volatile storage circuit is backed up and stored when the first to k-th context signals are switched and the data backed up is recovered to the volatile storage circuit. In a period during which the data stored in the volatile storage circuit is backed up to the first to j-th nonvolatile storage portions and is not recovered to the volatile storage circuit, the switch is turned off.

In the programmable logic device according to one embodiment of the present invention, the nonvolatile storage portion preferably includes a first transistor, a capacitor, a second transistor, and a third transistor. A gate of the first transistor is electrically connected to a wiring to which a first control signal is input. One of a source and a drain of the first transistor is electrically connected to a node of the volatile storage circuit through an inverter. One electrode of the capacitor is electrically connected to the other of the source and the drain of the first transistor. The other electrode of the capacitor is electrically connected to a wiring to which a ground potential is input. A gate of the second transistor is electrically connected to the other of the source and the drain of the first transistor and the one electrode of the capacitor. One of a source and a drain of the second transistor is electrically connected to the wiring to which the ground potential is input. A gate of the third transistor is electrically connected to a wiring to which a second control signal is input. One of a source and a drain of the third transistor is electrically connected to the other of the source and the drain of the second transistor. The other of the source and the drain of the third transistor is electrically connected to the node of the volatile storage circuit.

In the programmable logic device according to one embodiment of the present invention, the first control signal and the second control signal are preferably different in the first to j-th nonvolatile storage portions.

In the programmable logic device according to one embodiment of the present invention, the first transistor preferably includes a semiconductor film containing an oxide semiconductor.

According to one embodiment of the present invention, it is possible to provide a programmable logic device with a novel structure, i.e., a fine-grained multi-context PLD that can retain data of a register in a programmable logic element. According to one embodiment of the present invention, it is possible to provide a programmable logic device with a novel structure, i.e., a fine-grained multi-context PLD that can control power precisely by power gating in each programmable logic element without the use of a complex control circuit.

BRIEF DESCRIPTION OF THE DRAWINGS

In the accompanying drawings:

FIGS. 1A and 1B are schematic diagrams illustrating a PLD structure;

DETAILED DESCRIPTION OF THE INVENTION

Figure 2:
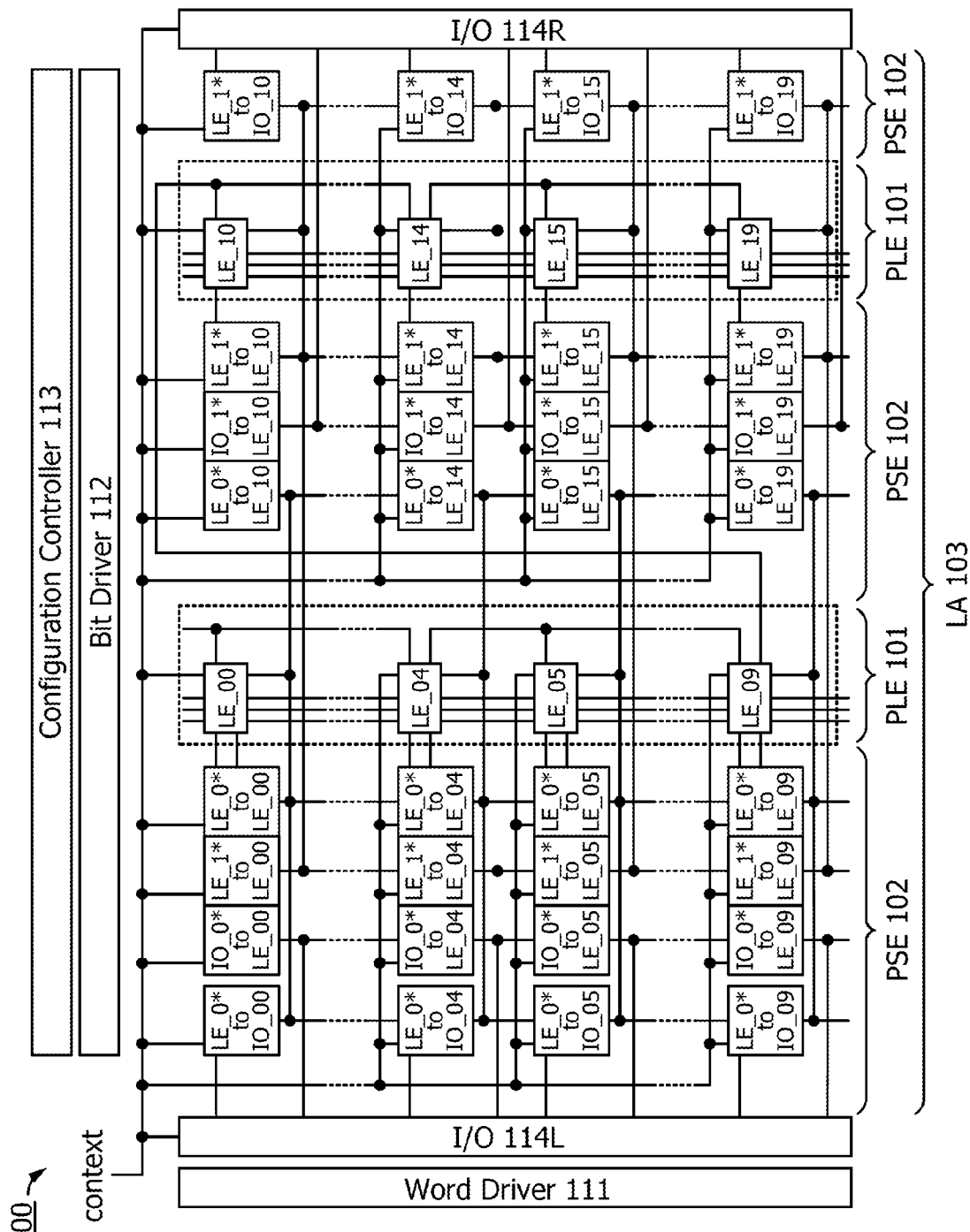
FIG. 2 is a block diagram illustrating a PLD structure.

Embodiments will be described below with reference to the drawings. Note that the embodiments can be implemented in various different ways and it will be readily appreciated by those skilled in the art that modes and details of the present invention can be modified in various ways without departing from the spirit and scope of the present invention. The present invention therefore should not be construed as being limited to the following description of the embodiments. Note that in structures of the invention described below, reference numerals denoting the same portions are used in common in different drawings.

In the drawings, the size, the layer thickness, or the region is exaggerated for clarity in some cases. Thus, embodiments of the present invention are not limited to such scales. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate (a gate terminal or a gate electrode), a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a region that functions as a source or a region that functions as a drain is not referred to as a source or a drain in some cases. In that case, one of the source and the drain might be referred to as a first electrode, and the other of the source and the drain might be referred to as a second electrode.

In this specification and the like, ordinal numbers such as "first," "second," and "third" are used to avoid confusion among components, and thus do not limit the number of the components.

In this specification and the like, the expression "A and B are connected" means the case where "A and B are electrically connected" in addition to the case where "A and B are directly connected." Here, the expression "A and B are electrically connected" means the case where electric signals can be transmitted and received between A and B when an object having any electric action exists between A and B.

In this specification and the like, terms for describing arrangement, such as "over" and "under," are used for convenience for describing the positional relationship between components with reference to drawings. Furthermore, the positional relationship between components is changed as appropriate in accordance with a direction in which each component is described. Thus, there is no limitation on terms used in this specification, and description can be made appropriately depending on the situation.

In this specification and the like, the positional relationships of circuit blocks in diagrams are specified for description, and even in the case where different circuit blocks have different functions in the diagrams, the different circuit blocks might be provided in an actual circuit or region so that different functions are achieved in the same circuit or region. The functions of circuit blocks in diagrams are specified for description, and even in the case where one circuit block is illustrated, blocks might be provided in an actual circuit or region so that processing performed by one circuit block is performed by a plurality of circuit blocks.

In this specification and the like, voltage refers to a difference between a given potential and a reference potential (e.g., a ground potential) in many cases. Thus, voltage, a potential, and a potential difference can also be referred to as a potential, voltage, and a voltage difference, respectively. Note that voltage refers to a difference between potentials of two points, and a potential refers to electrostatic energy (electric potential energy) of a unit electric charge at a given point in an electrostatic field.

In this specification and the like, the term "parallel" indicates that an angle formed between two straight lines is −10 to 10°, and accordingly includes the case where the angle is −5 to 5°. In addition, the term "perpendicular" indicates that an angle formed between two straight lines is 80 to 100°, and accordingly includes the case where the angle is 85 to 95°.

In this specification and the like, trigonal and rhombohedral crystal systems are included in a hexagonal crystal system.

In this specification and the like, data (configuration data) for setting the function of a programmable logic element and connection established with programmable switch elements is stored in a memory device such as a flash memory. To write configuration data stored in a memory device to a programmable logic element and a programmable switch element is referred to as configuration. A memory in each of a programmable logic element and a programmable switch element that stores configuration data is referred to as a configuration memory.

In this specification and the like, a programmable switch element refers to a circuit that has a function of setting a plurality of connection states in accordance with configuration data stored by configuration. In addition, in this specification and the like, the programmable switch element has a function of selecting any one of sets of configuration data in response to a context signal.

In this specification and the like, a programmable logic element refers to a circuit that has a function of setting a plurality of functions in accordance with configuration data stored by configuration. In addition, in this specification and the like, the programmable logic element has a function of selecting any one of sets of configuration data in response to a context signal.

In this specification and the like, configuration data refers to data containing data for setting the function of a programmable logic element and connection established with programmable switch elements.

In this specification and the like, a context signal refers to a signal for selecting a set of configuration data to be used among sets of contexts corresponding to a plurality of circuit structures stored in a PLD in advance. In addition, in this specification and the like, a context refers to a set of configuration data representing circuit structure data. Furthermore, a signal for switching circuit structure data is referred to as a context signal.

Embodiment 1

In this embodiment, PLD structures are described. FIGS. 1A and 1B are schematic diagrams illustrating PLD structures and PLD function effects.

A PLD 10 in FIG. 1A includes a plurality of programmable logic elements. FIG. 1A illustrates programmable logic elements by blocks. The programmable logic element can control power supply in each unit block. In FIG. 1A, a state in which power is supplied to programmable logic elements 11 represented by oblique hatching, i.e., a power-on state, and a state in which supply of power to programmable logic elements 12 is stopped, i.e., a power-off state are illustrated.

For example, FIG. 1A illustrates a state in which by switching first to k-th context signals (k is a natural number of 2 or more), a circuit structure is changed from a circuit structure using a first context (context_1) to a circuit structure using a second context (context_2), the circuit structure using the first context (context_1), a circuit structure using a k-th context (context_k), and a circuit structure using the second context (context_2).

The PLD 10 in FIG. 1A can change its circuit structure by a fine-grained multi-context method. Thus, the PLD 10 can have high flexibility in changing its circuit structure.

In addition, the PLD 10 in FIG. 1A can stop supply of power to programmable logic elements that are unnecessary for processing. Specifically, the PLD 10 in FIG. 1A can stop supply of power to the programmable logic elements 12. The PLD 10 in FIG. 1A includes fine-grained programmable logic elements; thus, in the case where power gating is performed, the PLD 10 can control power precisely with a small control unit.

Next, FIG. 1B is a schematic diagram of a register 20 included in a programmable logic element 11_$p$ (corresponding to a bottom right block among 4×4 blocks) in FIG. 1A. The programmable logic element 11_$p$ illustrated as an example is a programmable logic element in which stop or restart of power supply is selected by context switch.

The register 20 in FIG. 1B includes a volatile storage circuit 21 and a nonvolatile storage circuit 22. The volatile storage circuit 21 is, for example, a flip-flop D-FF. The nonvolatile storage circuit 22 includes first to j-th nonvolatile storage portions SR_1 to SR_j (j is a natural number of 2 or more and k or less).

Note that the number of the first to j-th nonvolatile storage portions SR_1 to SR_j corresponds to the number of the first to k-th contexts in FIG. 1A. The number of the first to j-th nonvolatile storage portions SR_1 to SR_j is preferably k to correspond to the number of the first to k-th contexts; however, the number of the first to j-th nonvolatile storage portions SR_1 to SR_j does not necessarily correspond to the number of the first to k-th contexts when backup of unnecessary data is omitted or a nonvolatile storage portion is shared. FIGS. 1A and 1B illustrate the first to k-th nonvolatile storage portions SR_1 to SR_k for simplicity.

Data stored in the volatile storage circuit 21 can be backed up (saved) or recovered (loaded) to the first to k-th nonvolatile storage portions SR_1 to SR_k. This backup and recovery operation can be performed between one volatile storage circuit 21 and any one of the first to k-th nonvolatile storage portions SR_1 to SR_k.

This backup and recovery operation is performed at timing of context switch in the PLD. Specifically, timing of backup is preferably immediately before context switch. In addition, timing of recovery is preferably immediately after context switch.

Here, backup operation at the time when a circuit structure is changed from the circuit structure using the first context (context_1) to the circuit structure using the second context (context_2) in FIG. 1A is described. In this operation, power is continuously supplied to the programmable logic element 11_$p$ in FIG. 1A even in the case of context switch.

Note that "d11" stored in the volatile storage circuit 21 or the nonvolatile storage circuit 22 that is described below with reference to FIG. 1B means "first data corresponding to context_1." Similarly, "d21" means "first data corresponding to context_2." Similarly, "d13" means "third data corresponding to context_1." Similarly, "d22" means "second data corresponding to context_2." In addition, "d10" means "initial data corresponding to context_1." Furthermore, "d20" means "initial data corresponding to context_2." Furthermore, "dk0" means "initial data corresponding to context_k."

As illustrated in FIG. 1B, data stored in the first to k-th nonvolatile storage portions SR_1 to SR_k is stored in accordance with the first to k-th contexts. For example, "d10" is stored in the first nonvolatile storage portion SR_1. In addition, "d20" is stored in the second nonvolatile storage portion SR_2. Furthermore, "dk0" is stored in the k-th nonvolatile storage portion SR_k.

In the backup operation at the time when a circuit structure is changed from the circuit structure using the first context (context_1) to the circuit structure using the second context (context_2) in FIG. 1A, "d11" stored in the volatile storage circuit 21 is backed up to the first nonvolatile storage portion SR_1. Thus, by the backup operation, data stored in the first nonvolatile storage portion SR_1 is rewritten from "d10" to "d11."

Next, backup and recovery operation at the time when a circuit structure is changed from the circuit structure using the second context (context_2) to the circuit structure using the first context (context_1) in FIG. 1A is described. In this operation, power is continuously supplied to the programmable logic element 11_$p$ in FIG. 1A even in the case of context switch.

In the backup operation at the time when a circuit structure is changed from the circuit structure using the second context (context_2) to the circuit structure using the first context (context_1) in FIG. 1A, "d22" stored in the volatile storage circuit 21 is backed up to the second nonvolatile storage portion SR_2. Thus, by the backup operation, data stored in the second nonvolatile storage portion SR_2 is rewritten from "d20" to "d22."

In the recovery operation at the time when a circuit structure is changed from the circuit structure using the second context (context_2) to the circuit structure using the first context (context_1) in FIG. 1A, "d11" stored in the first nonvolatile storage portion SR_1 of the nonvolatile storage circuit 22 is recovered to the volatile storage circuit 21. Thus, by the recovery operation, data stored in the volatile storage circuit 21 is rewritten from "d22" to "d11."

Next, backup operation at the time when a circuit structure is changed from the circuit structure using the first context (context_1) to the circuit structure using the k-th context (context_k) in FIG. 1A is described. In this operation, the supply of power to the programmable logic element 11_$p$ in FIG. 1A is stopped after context switch.

In the backup operation at the time when a circuit structure is changed from the circuit structure using the first context (context_1) to the circuit structure using the k-th context (context_k) in FIG. 1A, "d13" stored in the volatile storage circuit 21 is backed up to the first nonvolatile storage portion SR_1. Thus, by the backup operation, data stored in the first nonvolatile storage portion SR_1 is rewritten from "d11" to "d13."

In the programmable logic element 11_$p$ in FIG. 1A, the power supply is stopped in the circuit structure using the k-th context (context_k). Thus, "d13" stored in the volatile storage circuit 21 is lost. On the other hand, data is continuously stored in the first to k-th nonvolatile storage portions SR_1 to SR_k of the nonvolatile storage circuit 22.

Next, recovery operation at the time when a circuit structure is changed from the circuit structure using the k-th context (context_k) to the circuit structure using the second context (context_2) in FIG. 1A is described. In this operation, the supply of power to the programmable logic element 11_$p$ in FIG. 1A is restarted after context switch.

In the recovery operation at the time when a circuit structure is changed from the circuit structure using the k-th context (context_k) to the circuit structure using the second context (context_2) in FIG. 1A, "d22" stored in the second nonvolatile storage portion SR_2 of the nonvolatile storage circuit 22 is recovered to the volatile storage circuit 21. Thus, after the recovery operation, data stored in the volatile storage circuit 21 is "d22."

Through the operation of backup and recovery of data stored in the register of the programmable logic element, it is possible to employ processing scheduling in which the PLD temporarily stops processing using the first context, performs processing using the second context, and then restarts the processing using the first context from the middle of the processing. In addition, by performing power gating in each programmable logic element in accordance with each context, it is possible to supply power only to needed programmable logic elements as necessary. Furthermore, since the number of nonvolatile storage portions provided in a register of each programmable logic element corresponds to the number of contexts, it is possible to switch the context from any context to any other context. Consequently, it is possible to make out complex context switch scheduling.

Each set of configuration data in the PLD in this embodiment includes data on whether to supply power to a programmable logic element. That is, as illustrated in FIG. 1A, by context switch, whether to perform power gating on a programmable logic element can be selected independently. In other words, the PLD in this embodiment can perform the above control without an additional complex circuit.

Power gating in each programmable logic element can be performed when the on or off state of the switch for power gating is controlled by selecting a set of configuration data stored in a corresponding configuration memory in the programmable logic element in response to a context signal. Since the context signal is a signal for controlling all the circuits at once, it is possible to control power gating without an additional complex circuit.

In addition, data in a register of each programmable logic element can be backed up and recovered using a signal based on a context signal. Thus, it is not necessary to provide an additional logic circuit in each programmable logic element. In other words, it is possible to control data backup and recovery by just adding a simple logic circuit that generates a signal for controlling backup or recovery in accordance with a context signal.

Note that as a memory element used as the nonvolatile storage portion, it is preferable to use a memory element in which a transistor whose leakage current in an off state (off-state current) is extremely low is used and electric charge is held in a predetermined node. Such a memory element can have a layered structure of transistors and has an advantage of high integration degree. Furthermore, unlike a memory element in which data is written by supply of current, data can be written and read using voltage; thus, power consumed by data writing and reading can be reduced.

Here, low off-state current means that normalized off-state current per micrometer of a channel width at room temperature is lower than or equal to 10 zA. Since the off-state current is preferably as low as possible, the normalized off-state current is preferably lower than or equal to 1 zA, more preferably lower than or equal to 10 yA, still more preferably lower than or equal to 1 yA. Note that voltage between a source and a drain in that case is, for example, approximately 0.1 V, 5 V, or 10 V. An example of a transistor having such low off-state current is a transistor including an oxide semiconductor in a channel.

As described above, according to one embodiment of the present invention, a volatile storage circuit and a nonvolatile storage circuit are provided in a register of a programmable logic element whose function can be changed in response to a plurality of context signals. The nonvolatile storage circuit includes nonvolatile storage portions. The number of nonvolatile storage portions corresponds to the number of context signals. With such a structure, the function can be changed each time context signals are switched and data in the register that is changed when the function is changed can be backed up to the nonvolatile storage portion each time contexts are switched. In addition, the data in the register that has been backed up can be recovered to the volatile storage circuit each time contexts are switched.

According to one embodiment of the present invention, data on whether to turn on or off a switch for controlling power gating is allocated to a set of configuration data stored in a configuration memory, and the on or off state of the switch is controlled when the function is changed in response to a plurality of context signals. With such a structure, it is possible to control power precisely in each programmable logic element by controlling configuration data stored in advance and context signals.

This embodiment can be combined with any of the other embodiments as appropriate.

Embodiment 2

In this embodiment, a circuit structure example of a PLD, a circuit structure example of a programmable logic element, and a circuit structure example of each circuit included in the programmable logic element are described.

<Structure Example of PLD>

A structure example of a PLD is described. Part of the structure of a PLD 100 is illustrated in FIG. 2.

As the structure of the PLD 100, FIG. 2 illustrates a block diagram in which a logic array 103 (abbreviated to LA) including programmable logic elements 101 (abbreviated to PLE) and programmable switch elements 102 (abbreviated to PSE), a word line driver circuit 111 (Word Driver), a bit line driver circuit 112 (Bit Driver), a configuration control circuit 113 (Configuration Controller), an input/output terminal portion 114L (I/O), and an input/output terminal portion 114R (I/O) are provided.

FIG. 2 illustrates an example in which the programmable logic elements 101 and the programmable switch elements 102 are arranged in a column direction. A context signal ("context" in FIG. 2) is input to each of the programmable logic elements 101 and the programmable switch elements 102. It is possible to perform context switch by switching the context signals. In other words, it is possible to change a circuit structure by changing the function of the programmable logic element 101 and changing electrical connection with the programmable switch element 102.

In FIG. 2, 20 programmable logic elements 101 are provided. Note that in FIG. 2, the programmable logic elements arranged in the column direction are denoted by "LE_00" to "LE_19" in blocks for description.

In FIG. 2, four programmable switch elements are provided in one programmable logic element 101 (e.g., "LE_01"). For example, with regard to "LE_00" in FIG. 2, four blocks in a row direction that are denoted by "with regard to E_0* to IO_00," "IO_0* to LE_00," "LE_1* to LE_00," and "LE_0* to LE_00" in the blocks correspond to the four programmable switch elements.

Note that the programmable switch element "LE_0* to IO_00" in FIG. 2 means a programmable switch element for controlling electrical connection between any one of the programmable logic elements "LE_01" to "LE_09" and a first input/output terminal of the input/output terminal portion 114L. The programmable switch element "IO_0* to LE_00" means a programmable switch element for controlling electrical connection between any one of first to tenth input/output terminals of the input/output terminal portion 114L and the programmable logic element "LE_00". The programmable switch element "LE_1* to LE_00" means a programmable switch element for controlling electrical connection between any one of the programmable logic elements "LE_11" to "LE_19" and the programmable logic element "LE_00". The programmable switch element "LE_0* to LE_00" means a programmable switch element for controlling electrical connection between any one of the programmable logic elements "LE_01" to "LE_09" and the programmable logic element "LE_00". By the programmable switch elements 102, the PLD 100 can change connection between the programmable logic elements 101, the programmable switch elements 102, the input/output terminal portion 114L, and the input/output terminal portion 114R in response to a context signal, and can achieve a circuit structure with a different function.

Note that although not illustrated in FIG. 2, word signals are input from the word line driver circuit 111 to the programmable logic elements 101 and the programmable switch elements 102. Configuration data is input from the bit line driver circuit 112 to the programmable logic elements 101 and the programmable switch elements 102. The word signals control writing of configuration data. The configuration control circuit 113 has a function of controlling the word line driver circuit 111 and the bit line driver circuit 112.

Note that the input/output terminal portion 114L and the input/output terminal portion 114R in FIG. 2 each have a terminal for inputting/outputting signals to/from the logic array 103. For example, the input/output terminal portion 114L and the input/output terminal portion 114R each include 20 input/output terminals "IO_00" to "IO_19" corresponding to the programmable logic elements "LE_00" to "LE_19" as described above.

<Structure Example of Programmable Logic Element>

Figure 3:
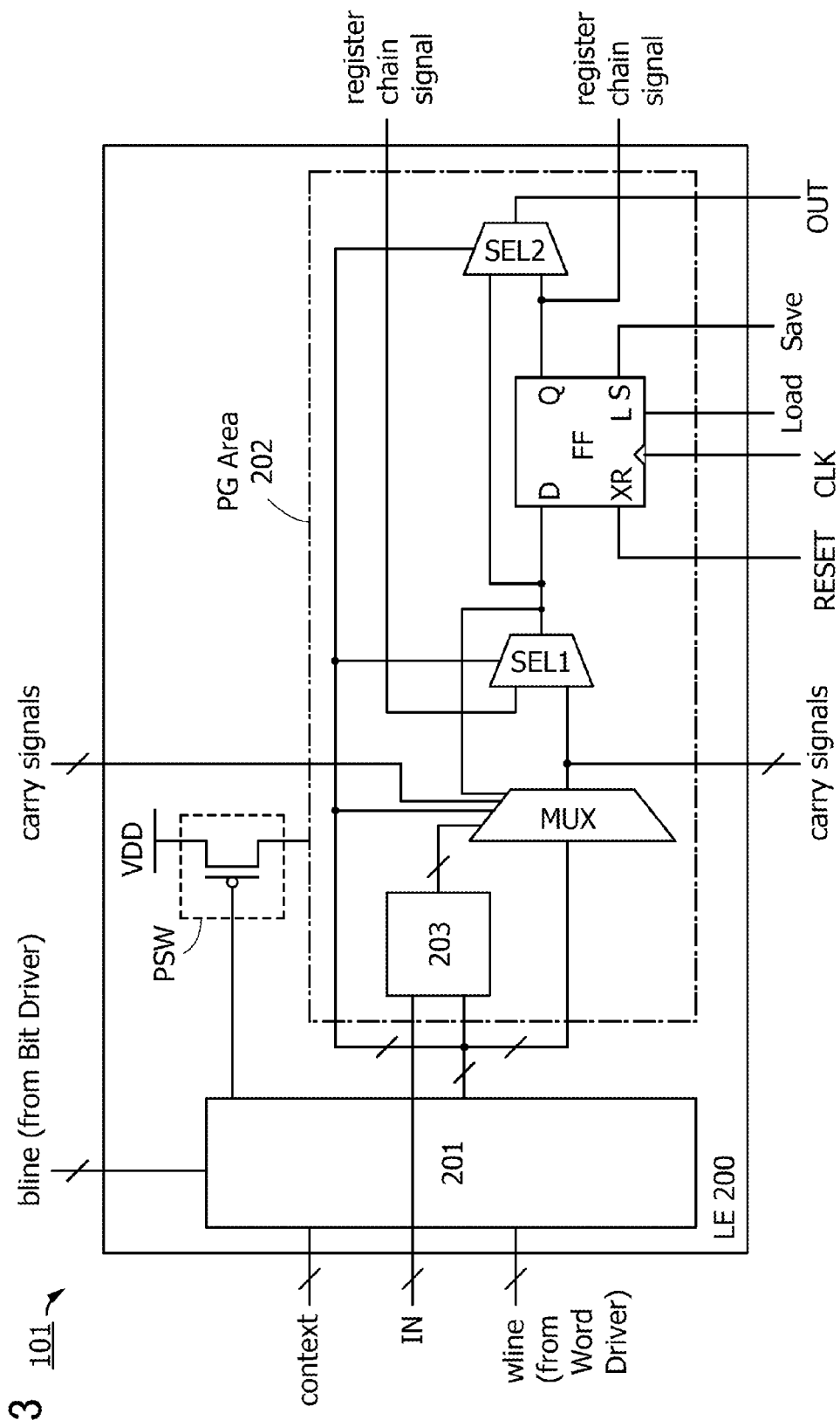
FIG. 3 is a circuit diagram illustrating a programmable logic element structure.

FIG. 3 is a circuit diagram illustrating the structure of the programmable logic element 101. The programmable logic element 101 in FIG. 3 includes a configuration memory portion 201, a power gating portion 202 (PG Area), and a switch PSW. The power gating portion 202 includes an exclusive OR circuit 203, a multiplexer MUX, a selector SEL1, a flip-flop FF, and a selector SEL2.

The configuration memory portion 201 is connected to a word line (wline) to which a word signal is input and a bit line (bline) to which configuration data is input. A context signal is input to the configuration memory portion 201. The configuration memory portion 201 includes a plurality of configuration memories (MC-CM: multi-context configuration memories) and stores configuration data in a predetermined configuration memory when a word signal is supplied.

The configuration memory portion 201 has a function of changing a circuit structure in response to a context signal by switching signals output to the exclusive OR circuit 203, the multiplexer MUX, the selector SEL1, the flip-flop FF, and the selector SEL2.

The configuration memory portion 201 also has a function of controlling power gating of the power gating portion 202 in response to a context signal. For power gating, the switch PSW is turned on or off in accordance with a set of configuration data selected by context switch.

In the power gating portion 202, signals (carry signals or register chain signals) for forming a carry chain or a register chain are input and output between adjacent programmable logic elements 101 by context switch.

The power gating portion 202 controls supply of a high power supply potential VDD to each circuit and controls whether to perform power gating by turning on or off the switch PSW. An input signal is input from an input terminal IN to the exclusive OR circuit 203 of the power gating portion 202.

The flip-flop FF functions as a register. The flip-flop FF includes a terminal to which data D is input, a terminal to which a reset signal RESET is input, a terminal to which a clock signal CLK is input, a terminal to which a first control signal Save is input, a terminal to which a second control signal Load is input, and a terminal from which data is output. The flip-flop FF further includes a volatile storage circuit and a nonvolatile storage circuit. The details of the flip-flop FF are described later.

As illustrated in FIG. 3, the switch PSW may be formed using a p-channel transistor, for example. The switch PSW is electrically connected to a wiring to which the high power supply potential VDD is input and controls whether to supply the high power supply potential VDD to the power gating portion 202 in accordance with the on or off state of the switch PSW.

<Structure Example of Configuration Memory>

Next, a structure example of the configuration memory portion 201 in the programmable logic element 101 and a structure example of the configuration memory are described.

Figure 4:
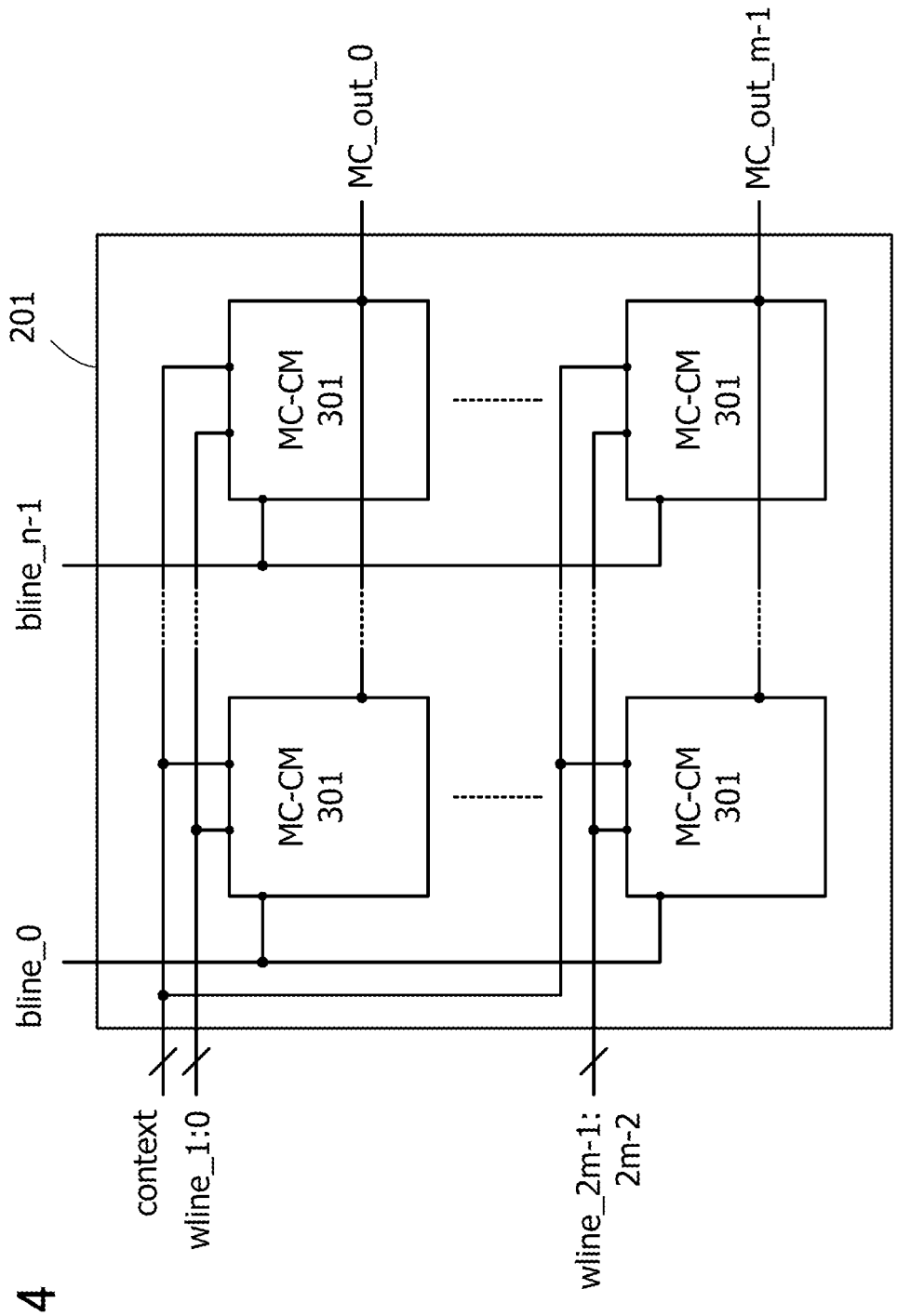
FIG. 4 is a block diagram illustrating a configuration memory structure.

The configuration memory portion 201 in FIG. 4 includes a plurality of configuration memories 301. In FIG. 4, the plurality of configuration memories 301 are arranged in m rows and n columns (m and n are each a natural number of 2 or more). A context signal is input to each of the configuration memories 301. Each of the configuration memories 301 is connected to word lines (wline_1:0 to wline_2m-1:2m-2) and bit lines (bline_0 to bline_n−1) to control writing of configuration data.

Note that in FIG. 4, the number of word lines provided in one configuration memory 301 is two (wline_1 and wline_0 in the case of wline_1:0) because the number of contexts switched by context signals in this embodiment is two. The number of word lines can be changed as appropriate depending on the number of contexts.

Figure 5A:
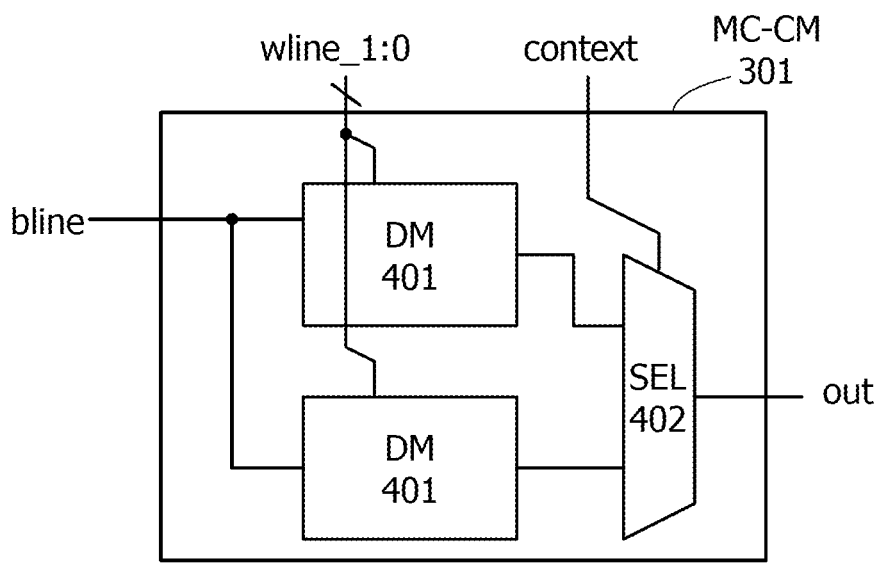
FIGS. 5A and 5B are circuit diagrams illustrating a configuration memory structure.

Next, FIG. 5A illustrates a specific circuit structure of the configuration memory 301 in FIG. 4. The configuration memory 301 includes a plurality of data storage portions 401 (DM: data memory cells) and a selector 402 (SEL). The number of the data storage portions 401 corresponds to the number of contexts.

The data storage portions 401 are connected to the word line (wline_1:0) and the bit line bline and can store configuration data input to the bit line bline at timing of supplying a word signal to the word line.

The selector SEL outputs a signal based on configuration data stored in any one of the data storage portions 401 from an output terminal out in response to a context signal.

Figure 5B:
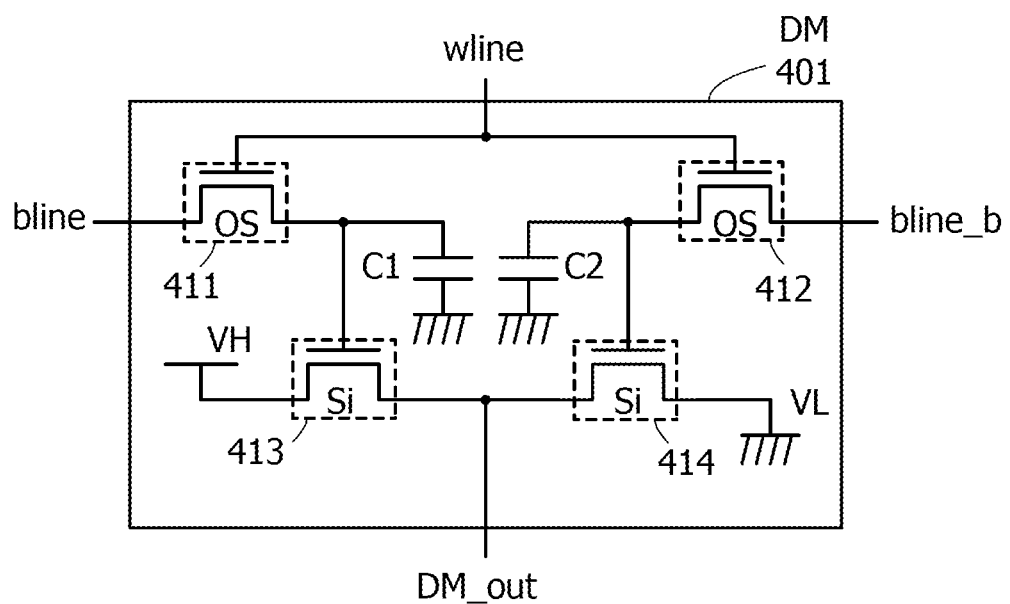

A circuit diagram in FIG. 5B is a specific circuit structure example of the data storage portion 401 in FIG. 5A.

The data storage portion 401 in FIG. 5B includes a transistor 411, a transistor 412, a transistor 413, a transistor 414, a capacitor C1, and a capacitor C2.

A gate of the transistor 411 is connected to the word line wline. One of a source and a drain of the transistor 411 is connected to the bit line bline. The other of the source and the drain of the transistor 411 is connected to the capacitor C1. A gate of the transistor 412 is connected to the word line wline. One of a source and a drain of the transistor 412 is connected to a wiring bline_b supplied with a signal obtained by inversion of a signal of the bit line bline. The other of the source and the drain of the transistor 412 is connected to the capacitor C2.

A gate of the transistor 413 is connected to the capacitor C1. One of a source and a drain of the transistor 413 is connected to a wiring to which a potential VH is input. The other of the source and the drain of the transistor 413 is connected to an output terminal DM_out. A gate of the transistor 414 is connected to the capacitor C2. One of a source and a drain of the transistor 414 is connected to a wiring to which a potential VL is input. The other of the source and the drain of the transistor 414 is connected to the output terminal DM_out. Note that the potential VH may be the high power supply potential VDD, and the potential VL may be a ground potential GND.

It is preferable to use transistors having low leakage current in an off state (off-state current) as the transistor 411 and the transistor 412. Here, low off-state current means that normalized off-state current per micrometer of a channel width at room temperature is lower than or equal to 10 zA. Since the off-state current is preferably as low as possible, the normalized off-state current is preferably lower than or equal to 1 zA, more preferably lower than or equal to 10 yA, still more preferably lower than or equal to 1 yA. Note that voltage between a source and a drain in that case is, for example, approximately 0.1 V, 5 V, or 10 V. An example of a transistor having such low off-state current is a transistor including an oxide semiconductor in a channel.

In the data storage portion 401 in FIG. 5B, the bit line bline (or bline_b) is connected to the capacitor C1 (or C2) by the transistor 411 (or 412). Configuration data is written and stored by controlling the on or off state of the transistor 411 (or 412). Thus, it is particularly preferable to use a transistor having low off-state current as the transistor 411 (or 412) that suppress the transfer of electric charge, that is, a potential change, at a node where the capacitor C1 (or C2) is provided in a period during which configuration data is stored.

Note that the node where the capacitor C1 (or C2) is provided is a node of a wiring to which the other of the source and the drain of the transistor 411 and the gate of the transistor 413 are connected and to which one electrode of the capacitor C1 is electrically connected, and corresponds to any of a connection wiring provided between elements, a capacitor added to the wiring, and the like. Although the capacitor C1 (or C2) is provided in FIG. 5B, the capacitor can be omitted by using gate capacitance of the transistors 413 and 414.

By forming the transistors 411 and 412 as transistors having low off-state current, the data storage portion 401 can be used as a nonvolatile memory that can store data after power supply is stopped. Thus, configuration data written to the data storage portion 401 temporarily can be continuously stored in the node where the capacitor C1 (or C2) is provided until the transistors 411 and 412 are turned on again. This can omit processing of loading configuration data from an external memory device, which leads to lower power consumption, shorter starting time, and the like.

Note that in this specification and the like, "OS" is written beside a transistor including an oxide semiconductor layer as a semiconductor layer (hereinafter abbreviated to an OS transistor) in some cases to indicate that the transistor includes an oxide semiconductor layer as a semiconductor layer. In this specification and the like, "Si" is written beside a transistor containing silicon in a semiconductor layer (hereinafter abbreviated to a Si transistor) in some cases to indicate that the transistor contains silicon in a semiconductor layer. In FIG. 5B, "OS" is written beside the transistors 411 and 412 to indicate that the transistors each include an oxide semiconductor layer as a semiconductor layer. In addition, in FIG. 5B, "Si" is written beside the transistors 413 and 414 to indicate that the transistors each contain silicon in a semiconductor layer.

Although the transistors 411 to 414 are n-channel transistors in FIG. 5B, the transistors 411 to 414 can be p-channel transistors.

<Circuit Structure Example of Flip-Flop>

Figure 6:
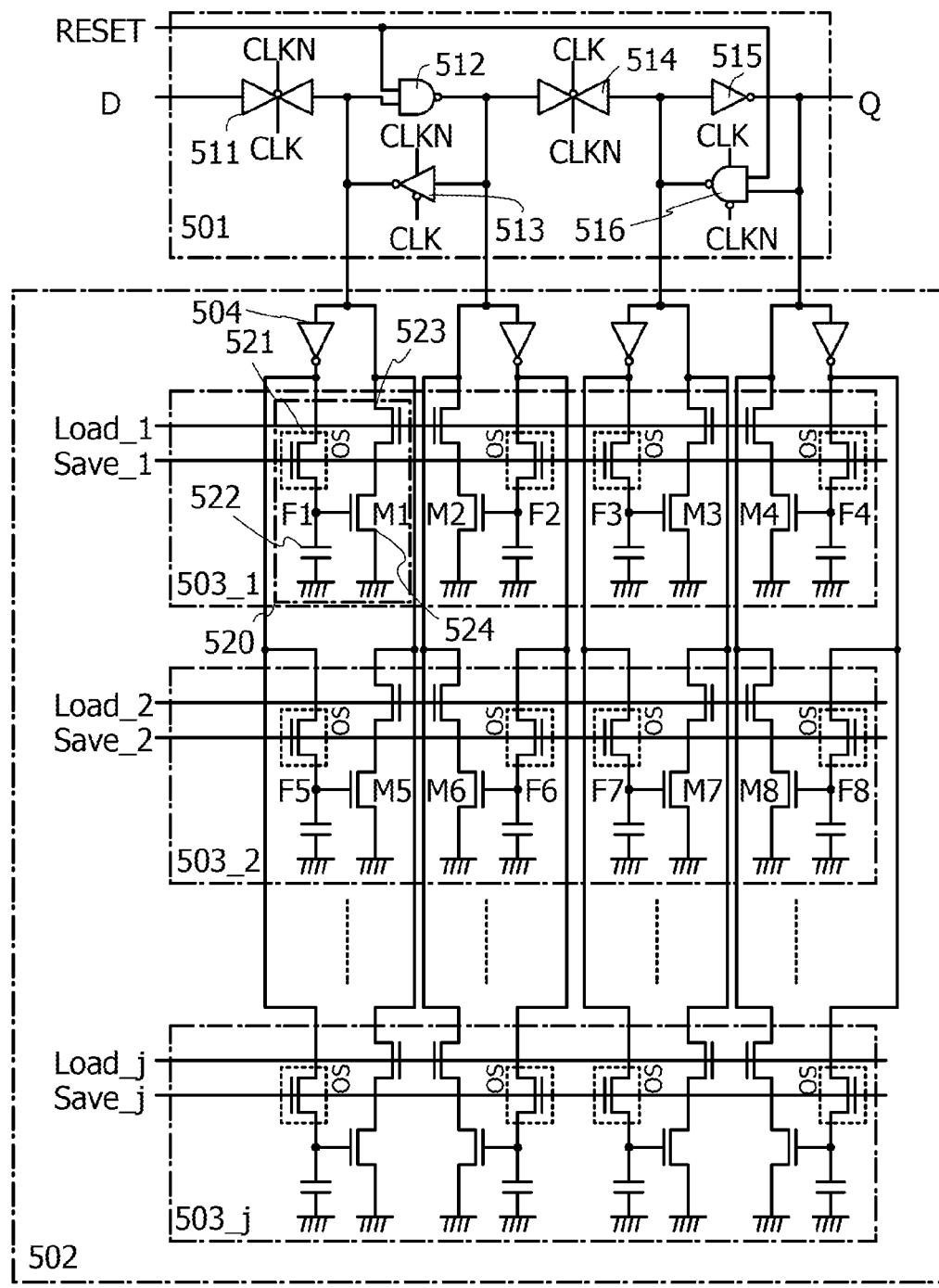
FIG. 6 is a circuit diagram illustrating a structure of a latch circuit included in a register.

FIG. 6 illustrates one aspect of the flip-flop FF in FIG. 3. A latch circuit 500 in FIG. 6 is an example of a latch circuit for storing 1-bit data of the flip-flop FF in FIG. 3.

The latch circuit 500 in FIG. 6 includes a volatile storage circuit 501 and a nonvolatile storage circuit 502. The nonvolatile storage circuit 502 includes nonvolatile storage portions 503_1 to 503_j and inverter circuits 504 that correspond to nodes storing data of the volatile storage circuit 501. The number of the nonvolatile storage portions 503_1 to 503_j corresponds to the number of contexts. Note that the volatile storage circuit 501 corresponds to the volatile storage circuit 21 in FIG. 1B in Embodiment 1, and the nonvolatile storage circuit 502 corresponds to the nonvolatile storage circuit 22 in FIG. 1B in Embodiment 1. The nonvolatile storage portions 503_1 to 503_j correspond to the first to k-th nonvolatile storage portions SR_1 to SR_k in FIG. 1B in Embodiment 1.

The volatile storage circuit 501 in FIG. 6 includes, for example, an analog switch 511, a NAND circuit 512, an inverter circuit 513, an analog switch 514, an inverter circuit 515, and a NAND circuit 516. The clock signal CLK and an inverted clock signal CLKN are input to the analog switch 511, the inverter circuit 513, the analog switch 514, and the NAND circuit 516. The reset signal RESET is input to the NAND circuit 512 and the NAND circuit 516. Note that the inverted clock signal CLKN input to each circuit is obtained by inversion of the clock signal CLK input to the latch circuit 500 by the inverter circuits.

The volatile storage circuit 501 has functions of holding a potential corresponding to data in inverter latches in a period during which power is continuously supplied and storing data. The nonvolatile storage circuit 502 has functions of holding a potential corresponding to data in a period during which power supply is stopped and storing data.

The nonvolatile storage portion 503_1 includes a plurality of data storage portions 520. The data storage portion 520 includes a transistor 521, a capacitor 522, a transistor 523, and a transistor 524. Note that the nonvolatile storage portion 503_1 in FIG. 6 includes four circuits that correspond to the data storage portion 520 storing data in accordance with the nodes storing data of the volatile storage circuit 501.

The nonvolatile storage portions 503_2 to 503_j have the same circuit structures as illustrated in FIG. 6.

One of a source and a drain of the transistor 521 in the data storage portion 520 is connected to one of nodes included in the inverter latch of the volatile storage circuit 501 through the inverter circuit 504. A gate of the transistor 521 is connected to a wiring to which a first control signal Save_1 is input. The other of the source and the drain of the transistor 521 is connected to a gate of the transistor 524 and a first electrode of the capacitor 522.

A second electrode of the capacitor 522 and the other of a source and a drain of the transistor 524 are connected to a wiring to which a ground potential is input.

One of a source and a drain of the transistor 523 is connected to one of the nodes included in the inverter latch of the volatile storage circuit 501. The other of the source and the drain of the transistor 523 is connected to one of the source and the drain of the transistor 524. A gate of the transistor 523 is connected to a wiring to which a second control signal Load__1 is input.

In the nonvolatile storage portion 503_1, nodes to which the other of the source and the drain of the transistor 521, the first electrode of the capacitor 522, and the gate of the transistor 524 are connected are referred to as a node F1, a node F2, a node F3, and a node F4, as illustrated in FIG. 6. Similarly, in the nonvolatile storage portion 503_2, such nodes are referred to as a node F5, a node F6, a node F7, and a node F8, as illustrated in FIG. 6. Transistors whose gates are connected to the node F1, the node F2, the node F3, and the node F4 are also referred to as transistors M1 to M4 for description. Transistors whose gates are connected to the node F5, the node F6, the node F7, and the node F8 are also referred to as transistors M5 to M8 for description.

Note that signals that correspond to the first control signals Save__1 and the second control signals Load__1 that are input to the nonvolatile storage portions 5032 to 503__j are referred to as first control signals Save__2 to Save_j and second control signals Load__2 to Load_j, as illustrated in FIG. 6. The first control signals Save__1 to Save_j and the second control signals Load__1 to Load_j are control signals that can be generated by just adding a simple logic circuit. Specifically, a signal obtained by an AND of the context signal and a timing signal for data backup or recovery can be used as the first control signals Save__1 to Save_j and the second control signals Load__1 to Load_j.

With the circuit structure in FIG. 6, in the programmable logic element, by setting any one of the first control signals Save__1 to Save_j, for example, the first control signal Save__1 at an H level, data of the node included in the inverter latch of the volatile storage circuit 501 can be backed up to the node F1, the node F2, the node F3, and the node F4. In addition, by setting any one of the second control signals Load__1 to Load_j, for example, the second control signal Load__1 at an H level, the data of the node F1, the node F2, the node F3, and the node F4 can be recovered to the node included in the inverter latch of the volatile storage circuit 501.

It is preferable to use a transistor having low leakage current in an off state (off-state current) as the transistor 521. In the data storage portion 520 in FIG. 6, data of the volatile storage circuit 501 can be written and stored by controlling the on or off state of the transistor 521. Thus, it is particularly preferable to use a transistor having low off-state current as the transistor 521 for suppressing the transfer of electric charge, that is, a potential change, at the node F1 in a period during which the data of the volatile storage circuit 501 is stored.

By forming the transistor 521 as a transistor having low off-state current, the data storage portion 520 can be used as a nonvolatile memory that can store data after power supply is stopped. Thus, the data of the volatile storage circuit 501 that is written to the data storage portion 520 temporarily can be continuously stored in the node F1 until the transistor 521 is turned on again. This can reduce time and power required for data recalculation because the data stored temporarily is retained even if a period during which supply of power to the flip-flop including the latch circuit 500 is provided.

Although the transistors 521, 523, and 524 are n-channel transistors in FIG. 6, the transistors 521, 523, and 524 can be p-channel transistors.

<Operation Example of Latch Circuit>

Next, the operation of the latch circuit 500 in FIG. 6 is described with reference to timing charts in FIG. 7 and FIG. 8.

Figure 7:
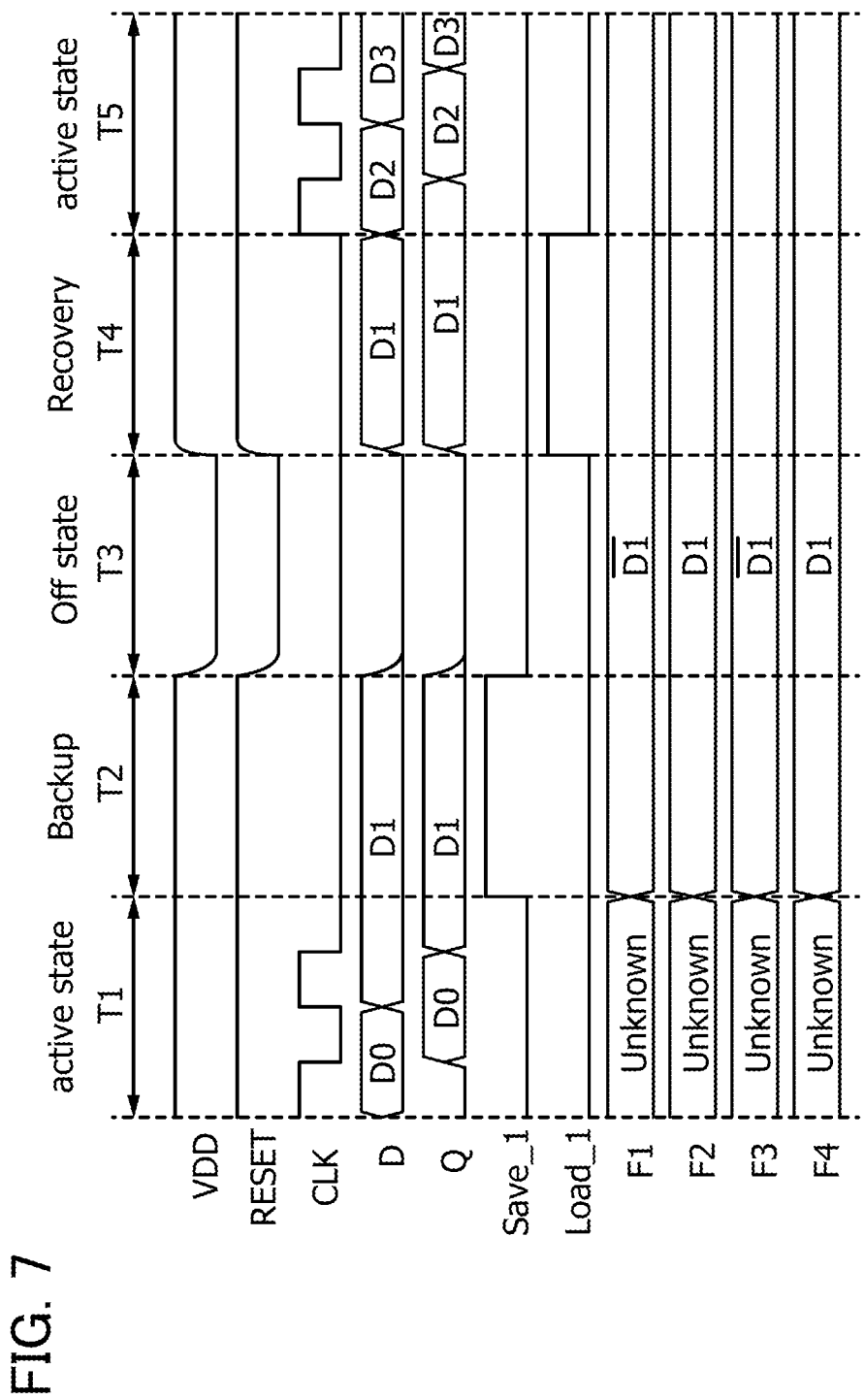
FIG. 7 is a timing chart showing latch circuit operation.

In FIG. 7, VDD represents the potential of a wiring for inputting the high power supply potential VDD to the latch circuit 500. RESET represents the potential of a wiring to which a reset signal is input. CLK represents the potential of a wiring to which a clock signal is input. D represents the potential of a wiring to which a data signal is input. Q represents the potential of a wiring to which an output signal is input. Save__1 represents the potential of a wiring to which the first control signal Save__1 is input. Load__1 represents the potential of a wiring to which the second control signal Load__1 is input. F1 represents the potential of the node F1. F2 represents the potential of the node F2. F3 represents the potential of the node F3. F4 represents the potential of the node F4.

The data signal and the output signal have H-level potentials or L-level potentials and are denoted by "D0" to "D3" in the input order here. The inverted value of "D0" is denoted by "D0_b." In the drawing, the inverted value of "D0" is denoted by "D0" with an over line.

The timing chart of FIG. 7 shows states of the latch circuit 500 in periods T1 to T5. The period T1 is a normal operation period (active state). The period T2 is a data backup period (Backup). The period T3 is an operation stop period (Off state). The period T4 is a data recovery period (Recovery). The period T5 is a normal operation period (active state).

In the period T1, at timing of when the clock signal is changed from an L level to an H level, the data signal is changed from "D0" to "D1." This data signal "D1" is input to inverter latches of a master latch and a slave latch as the data of the volatile storage circuit 501. In the period T1, at timing of when the clock signal is changed from the H level to the L level, the data loaded into the volatile storage circuit 501 is output as the output signal "D1." Note that in the period T1, the potentials of the nodes F1 to F4 are undefined (unknown); however, data written in the previous period may be stored.

Next, in the period T2, the clock signal is fixed at the L level, and the first control signal Save__1 is set at the H level. At this time, the volatile storage circuit 501 retains the loaded data "D1" in the inverter latches. In addition, the data "D1" loaded into the volatile storage circuit 501 is input to the node F1 through the inverter circuit 504, and the potential of the node F1 is "D1_b." Similarly, any one of potentials held in the inverter latches of the volatile storage circuit 501 is applied to the nodes F2 to F4, and the nodes F2 to F4 get into states as shown in FIG. 7.

In the period T3, supply of power supply voltage is stopped and the first control signal Save__1 is set at the L level. At this time, the nodes F1 to F4 become floating and store data. In this manner, data is stored in the nonvolatile storage circuit 502 and the data of the volatile storage circuit 501 is lost.

In the period T4, the supply of the power supply voltage is restarted and the second control signal Load__1 is set at the H level. At this time, the potential of one or the other of the nodes included in the inverter latch of the volatile storage circuit 501 is determined by a difference in channel resistance between the transistor M1 and M2 and a difference in channel resistance between the transistor M3 and M4. For example, in the case where the data "D1" is at the H level, the node F1 is at the L level. In that case, the transistor M1 is off, and a wiring for supplying the ground potential GND is not electrically connected to one of the nodes included in the inverter latch of the volatile storage circuit 501. On the other hand, in the case where the data "D1" is at the H level, the node F2 is at the H level. In that case, the transistor M2 is on, and the wiring for supplying the ground potential GND is electrically connected to the other of the nodes included in the inverter latch of the volatile storage circuit 501. Thus, with regard to the potential of one or the other of the nodes included in the inverter latch of the volatile storage circuit 501, the node at the L level is always determined by the potentials of the nodes F1 to F4, and data can be recovered.

When the supply of the power supply voltage is restarted, the potential D of the wiring to which the data signal is input returns to "D1", and an L-level potential is supplied to the wiring to which the clock signal is input. At this time, the output potential of the latch circuit 500 is "D1.". Thus, data can be recovered to the volatile storage circuit 501.

In the period T5, the control signal Load_1 is set at the L level, and then, normal operation is started and data computation is restarted.

With the above structure, it is possible to provide a programmable logic device that can stop and restart supply of power supply voltage easily. Data backup and recovery are performed with the volatile storage circuit 501 and the non-volatile storage circuit 502, so that the supply of power supply voltage can be stopped as appropriate and power consumption can be reduced.

Note that in the circuit structure of the latch circuit in FIG. 6, the logics of data stored in the nodes F1 and F2 are always opposite and the logics of data stored in the nodes F3 and F4 are always opposite; thus, at the time of recovery operation, one of the transistors M1 and M2 and one of the transistors M3 and M4 are always turned on and an L-level potential is supplied to the inverter latches of the volatile storage circuit 501. Thus, data can be recovered at high speed and driving voltage can be lowered.

Figure 8:
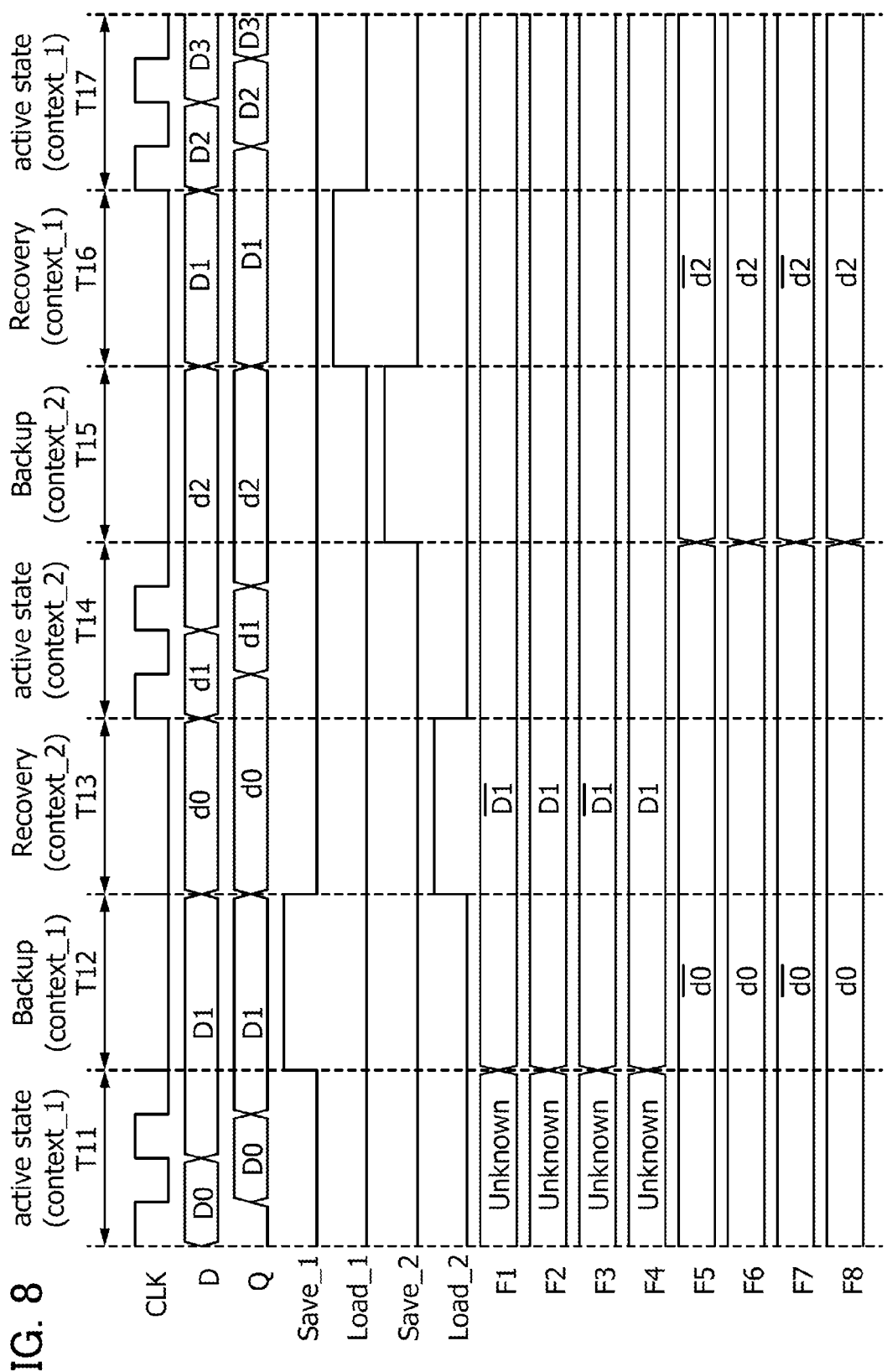
FIG. 8 is a timing chart showing latch circuit operation.

FIG. 7 shows operation at the time when supply of power supply voltage is stopped, and FIG. 8 shows operation at the time of context switch. FIG. 8 illustrates an example in which a context is changed from a first context to a second context and then is changed to the first context.

In FIG. 8, CLK represents the potential of a wiring to which a clock signal is input. D represents the potential of a wiring to which a data signal is input. Q represents the potential of a wiring to which an output signal is input. Save_1 represents the potential of a wiring to which the first control signal Save_1 is input. Load_1 represents the potential of a wiring to which the second control signal Load_1 is input. Save_2 represents the potential of a wiring to which the first control signal Save_2. Load_2 represents the potential of a wiring to which the second control signal Load_2 is input. F1 represents the potential of the node F1. F2 represents the potential of the node F2. F3 represents the potential of the node F3. F4 represents the potential of the node F4. F5 represents the potential of the node F5. F6 represents the potential of the node F6. F7 represents the potential of the node F7. F8 represents the potential of the node F8.

The data signal and the output signal have H-level potentials or L-level potentials. Here, data obtained using the first context are denoted by "D0" to "D3" in the input order, and data obtained using the second context are denoted by "d0" to "d3" in the input order. The inverted values of "D0" and "d0" are denoted by "D0_b and "d0_b", respectively. In the drawing, the inverted values of "D0" and "d0" are denoted by "D0" and "d0" with over lines.

The timing chart of FIG. 8 shows states of the latch circuit 500 in periods T11 to T17. The period T11 is a normal operation period (active state) using the first context. The period T12 is a data backup period (Backup) using the first context. The period T13 is a data recovery period (Recovery) using the second context. The period T14 is a normal operation period (active state) using the second context. The period T15 is a data backup period (Backup) using the second context. The period T16 is a data recovery period (Recovery) using the first context. The period T17 is a normal operation period (active state) using the first context.

First, data storage using the first context is performed. In the period T11, at timing of when the clock signal is changed from an L level to an H level, the data signal is changed from "D0" to "D1." This data signal "D1" is loaded into the inverter latches of the master latch and the slave latch as the data of the volatile storage circuit 501. In the period T11, at timing of when the clock signal is changed from the H level to the L level, the data loaded into the volatile storage circuit 501 is output as the output signal "D1." Note that in the period T11, the potentials of the nodes F1 to F4 are undefined (unknown). Furthermore, in the period T11, the potentials of the nodes F5 to F8 are denoted by "d0" and "d0_b" that are data written in the previous period.

Next, to switch data storage from data storage using the first context to data storage using the second context, data backup using the first context is performed. In the period T12, the clock signal is fixed at the L level, and the first control signal Save_1 is set at the H level. At this time, the volatile storage circuit 501 retains the loaded data "D1" in the inverter latches. In addition, the data "D1" loaded into the volatile storage circuit 501 is input to the node F1 through the inverter circuit 504, and the potential of the node F1 is "D1_b." Similarly, any one of potentials held in the inverter latches of the volatile storage circuit 501 is applied to the nodes F2 to F4, and the nodes F2 to F4 get into states as shown in FIG. 8.

Next, the data backed up in the previous period is recovered using the second context. In the period T13, the second control signal Load_2 is set at the H level. At this time, the potential of one or the other of the nodes included in the inverter latch of the volatile storage circuit 501 is determined by a difference in channel resistance between the transistor M5 and M6 and a difference in channel resistance between the transistor M7 and M8. For example, in the case where the data "d0" is at the H level, the node F5 is at the L level. In that case, the transistor M5 is off, and the wiring for supplying the ground potential GND is not electrically connected to one of the nodes included in the inverter latch of the volatile storage circuit 501. On the other hand, in the case where the data "d0" is at the H level, the node F6 is at the H level. In that case, the transistor M6 is on, and the wiring for supplying the ground potential GND is electrically connected to the other of the nodes included in the inverter latch of the volatile storage circuit 501. Thus, with regard to the potential of one or the other of the nodes included in the inverter latch of the volatile storage circuit 501, the node at the L level is always determined by the potentials of the nodes F5 to F8, and data can be recovered.

Next, data storage using the second context is performed in accordance with the recovered data. In the period T14, at timing of when the clock signal is changed from the L level to the H level, a data signal "d0" is changed to "d1" and a data signal "d1" is changed to "d2." These data signals "d1" and "d2" are loaded into the inverter latches of the master latch and the slave latch as the data of the volatile storage circuit 501. In the period T14, at timing of when the clock signal is changed from the H level to the L level, the data loaded into the volatile storage circuit 501 is output as output signals "d1" and "d2." Note that in the period T14, the potentials of the nodes F1 to F4 are denoted by "D1" and "d1_b" that are data written in the previous period. Furthermore, in the period T14, the potentials of the nodes F5 to F8 are denoted by "d0" and "d0_b" that are data written in the previous period.

Next, to switch data storage from data storage using the second context to data storage using the first context, data backup using the second context is performed. In the period T15, the clock signal is fixed at the L level, and the first control signal Save_2 is set at the H level. At this time, the volatile storage circuit 501 retains the loaded data "d2" in the inverter latches. In addition, the data "d2" loaded into the volatile storage circuit 501 is input to the node F5 through the inverter circuit 504, and the potential of the node F5 is "d2_b." Similarly, any one of potentials held in the inverter latches of the volatile storage circuit 501 is applied to the nodes F6 to F8, and the nodes F6 to F8 get into states as shown in FIG. 8.

Next, the data backed up in the previous period is recovered using the first context. In the period T16, the second control signal Load_1 is set at the H level. At this time, the potential of one or the other of the nodes included in the inverter latch of the volatile storage circuit 501 is determined by the difference in channel resistance between the transistor M1 and M2 and the difference in channel resistance between the transistor M3 and M4. For example, in the case where the data "D1" is at the H level, the node F1 is at the L level. In that case, the transistor M1 is off, and the wiring for supplying the ground potential GND is not electrically connected to one of the nodes included in the inverter latch of the volatile storage circuit 501. On the other hand, in the case where the data "D1" is at the H level, the node F2 is at the L level. In that case, the transistor M2 is on, and the wiring for supplying the ground potential GND is electrically connected to the other of the nodes included in the inverter latch of the volatile storage circuit 501. Thus, with regard to the potential of one or the other of the nodes included in the inverter latch of the volatile storage circuit 501, the node at the L level is always determined by the potentials of the nodes F1 to F4, and data can be recovered.

Next, in the period T17, data storage using the first context is restarted in accordance with the recovered data.

With the above structure, it is possible to provide a programmable logic device that can retain data of a register in a programmable logic element and can perform context switch easily. In addition, with the above structure, context switch including data backup and recovery between the volatile storage circuit 501 and the nonvolatile storage circuit 502 can be performed, and data can be retained when power supply is stopped. Furthermore, with the above structure, supply of power supply voltage can be stopped and restarted as appropriate, so that power consumption can be reduced.

<Structure Example of Programmable Switch Element>

Next, a structure example of the programmable switch element in FIG. 2 is described.

Figure 9:
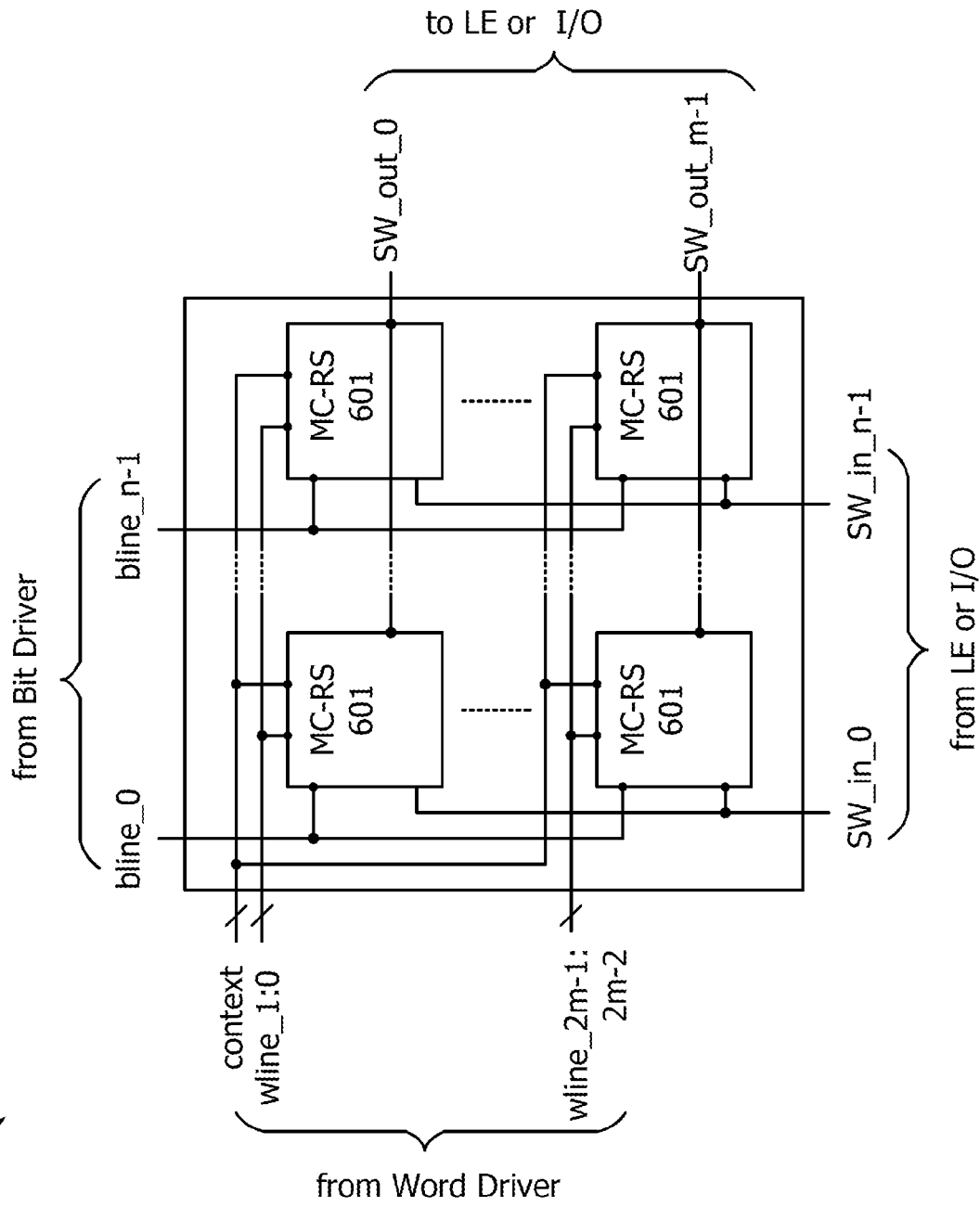
FIG. 9 is a block diagram illustrating a programmable switch element structure.

The programmable switch element 102 in FIG. 9 includes a plurality of routing switch portions 601 (MC-RS: multi-context routing switch). In FIG. 9, the plurality of routing switch portions 601 are arranged in m rows and n columns (m and n are each a natural number of 2 or more). A context signal is input to each of the routing switch portions 601. The routing switch portions 601 are connected to word lines (wline_1:0 to wline_2m-1:2m-2), bit lines (bline_0 to bline_n-1), input lines (SW_in_0 to SW_in_n-1), and output lines (SW_out_0 to SW_out_m-1), and writing of configuration data and electrical connection between wirings in accordance with the configuration data are controlled.

Note that in FIG. 9, the number of word lines provided in one routing switch portion 601 is two (wline_1 and wline_0 in the case of wline_1:0) because the number of contexts switched by context signals in this embodiment is two. The number of word lines can be changed as appropriate depending on the number of contexts.

Figure 10A:
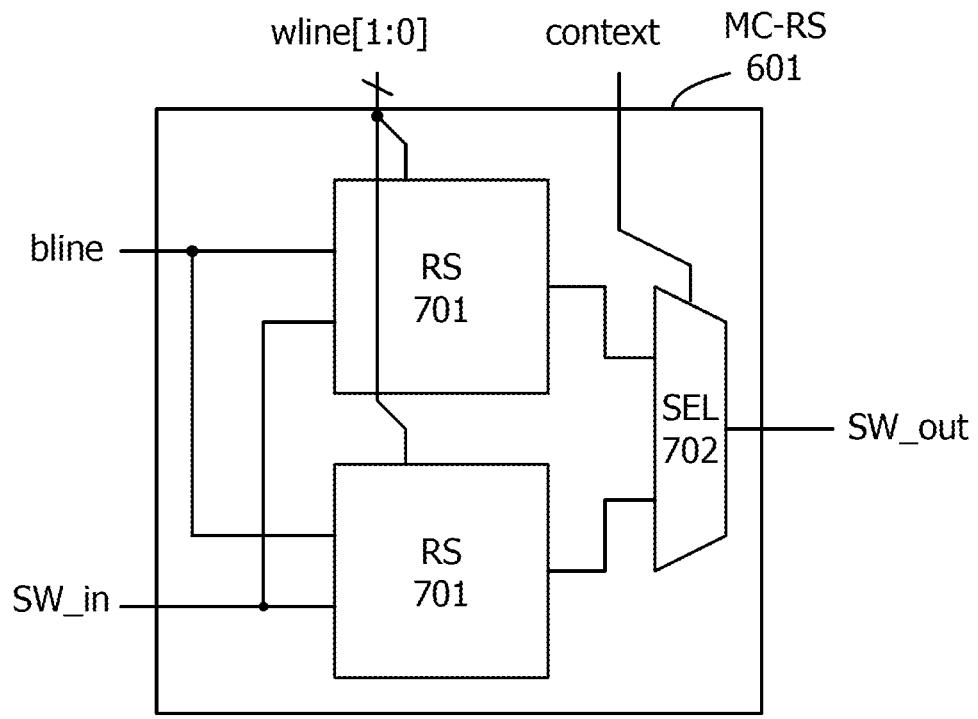
FIGS. 10A and 10B are circuit diagrams illustrating a programmable switch element structure.

Next, FIG. 10A illustrates a specific circuit structure of the routing switch portion 601 in FIG. 9. A routing switch portion 601 includes routing switches 701 (RS: routing switch) and a selector 702 (SEL). The number of the routing switches 701 corresponds to the number of contexts Each of the routing switches 701 is connected to the word line (wline_1:0), the bit line bline, and the input line SW_in and can store configuration data input to the bit line at timing of supplying a word signal to the word line. The routing switch 701 changes electrical connection between any one of the input lines SW_in and the selector SEL in accordance with configuration data.

The selector SEL changes electrical connection between any one of the input lines SW_in and any one of the output lines SW_out in response to a context signal.

Figure 10B:
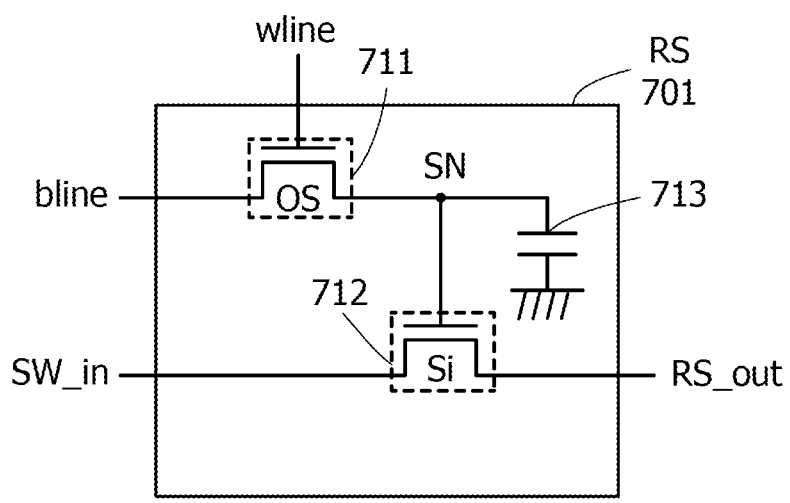

A circuit diagram in FIG. 10B illustrates a specific circuit structure example of the routing switch 701 in FIG. 10A.

The routing switch 701 in FIG. 10B includes a transistor 711, a transistor 712, and a capacitor 713. A gate of the transistor 711 is connected to the word line wline. One of a source and a drain of the transistor 711 is connected to the bit line bline. The other of the source and the drain of the transistor 711 is connected to the capacitor 713.

A gate of the transistor 712 is connected to a node SN. One of a source and a drain of the transistor 712 is connected to the input line SW_in. The other of the source and the drain of the transistor 712 is connected to an output terminal RS_out.

It is preferable to use a transistor having low leakage current in an off state (off-state current) as the transistor 711. In the routing switch 701 in FIG. 10B, configuration data can be written and stored by controlling the on or off state of the transistor 711. Thus, it is particularly preferable to use a transistor having low off-state current as a switch for suppressing a potential change caused by the transfer of electric charge at the node SN in a period during which the configuration data is stored.

By forming the transistor 711 as a transistor having low off-state current, the routing switch 701 can be used as a nonvolatile memory that retains data after power supply is stopped. Thus, the configuration data written to the routing switch 701 temporarily can be continuously stored in the node SN until the transistor 711 is turned on again. This can reduce time and power required for rewriting the configuration data because the configuration data stored temporarily is retained even if a period during which supply of power to the routing switch portion 601 is provided.

Note that the node SN in FIG. 10B is a node of a wiring to which the other of the source and the drain of the transistor 711 and the gate of the transistor 712 are connected and to which one electrode of the capacitor 713 is electrically connected, and corresponds to any of a connection wiring provided between elements, a capacitor added to the wiring, and the like. Although the capacitor 713 is provided in FIG. 10B, the capacitor can be omitted by using gate capacitance of the transistor 712.

Although the transistors 711 and 712 are n-channel transistors in FIG. 10B, the transistors 711 and 712 can be p-channel transistors.

As described above, according to one embodiment of the present invention, a volatile storage circuit and a nonvolatile storage circuit that includes a plurality of nonvolatile storage portions are provided in a register of a programmable logic element whose function can be changed in response to a plurality of context signals. The number of nonvolatile storage portions corresponds to the number of context signals. With such a structure, data of the volatile storage circuit can be backed up and recovered in accordance with contexts each time the contexts are switched. As a result, it is possible to obtain a programmable logic device that can retain data of a register in a programmable logic element.

According to one embodiment of the present invention, a switch is provided in a programmable logic element, data on whether to turn on or off a switch for controlling power gating is allocated to a set of configuration data, and the on or off state of the switch is controlled when the function is changed in response to a plurality of context signals. With such a structure, it is possible to control power precisely by power gating in each programmable logic element without the use of a complex control circuit.

This embodiment can be combined with any of the other embodiments as appropriate.

Embodiment 3

In this embodiment, an oxide semiconductor layer that can be used as the semiconductor layer of the transistor with low off-state current described in the above embodiment is described.

An oxide semiconductor used for a channel formation region in the semiconductor layer of the transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide whose composition is in the neighborhood of the above composition is preferably used.

When an oxide semiconductor film included in the semiconductor layer contains a large amount of hydrogen, hydrogen and the oxide semiconductor are bonded to each other, so that part of hydrogen serves as a donor and causes an electron (carrier). As a result, the threshold voltage of the transistor is shifted in a negative direction. Thus, it is preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is reduced by the dehydration treatment (dehydrogenation treatment) in some cases. Thus, it is preferable that oxygen be added to the oxide semiconductor film to fill oxygen vacancies increased by the dehydration treatment (dehydrogenation treatment). In this specification and the like, supplying oxygen to an oxide semiconductor film is expressed as oxygen adding treatment, and treatment for making the oxygen content of an oxide semiconductor film be in excess of that in the stoichiometric composition is expressed as treatment for making an oxygen-excess state in some cases.

In this manner, hydrogen or moisture is removed from the oxide semiconductor film by dehydration treatment (dehydrogenation treatment) and oxygen vacancies are filled by oxygen adding treatment, so that the oxide semiconductor film can be an intrinsic (i-type) or substantially intrinsic oxide semiconductor film. Note that the substantially intrinsic oxide semiconductor film means an oxide semiconductor film that contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

In this manner, the transistor including an intrinsic (i-type) or substantially intrinsic i-type oxide semiconductor film can have extremely favorable off-state current characteristics. For example, the drain current at the time when the transistor including an oxide semiconductor film is off can be less than or equal to $1\times10^{-18}$ A, preferably less than or equal to $1\times10^{-21}$ A, and more preferably $1\times10^{-24}$ A at room temperature (approximately 25° C.); or less than or equal to $1\times10^{-15}$ A, preferably $1\times10^{-18}$ A, more preferably less than or equal to $1\times10^{-21}$ A at 85° C. The off state of a transistor refers to a state where gate voltage is much lower than the threshold voltage in an n-channel transistor. Specifically, when the gate voltage is lower than the threshold voltage by 1 V or more, 2 V or more, or 3 V or more, the transistor is off.

A deposited oxide semiconductor film is roughly classified into a single-crystal oxide semiconductor film and a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around $31°$. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around $56°$. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around $56°$. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around $56°$.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

In addition, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Furthermore, when an impurity is added to the CAAC-OS film, the crystallinity in a region to which the impurity is added is changed, and the crystallinity in the CAAC-OS film varies depending on regions.

Note that when the CAAC-OS film with an $InGaZnO_4$ crystal is analyzed by an out-of-plane method, a peak of $2\theta$ may also be observed at around $36°$, in addition to the peak of $2\theta$ at around $31°$. The peak of $2\theta$ at around $36°$ indicates that a crystal having no c-axis alignment is included in part of the CAAC-OS film. It is preferable that in the CAAC-OS film, a peak of $2\theta$ appear at around $31°$ and a peak of $2\theta$ do not appear at around $36°$.

In a transistor including the CAAC-OS film, changes in electrical characteristics of the transistor due to irradiation with visible light or ultraviolet light are small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

This embodiment can be combined with any of the other embodiments as appropriate.

Embodiment 4

In this embodiment, a cross-sectional structure of a transistor that is used in a circuit portion included in a programmable switch element in a PLD according to one embodiment of the disclosed invention is described with reference to drawings.

Figure 11:
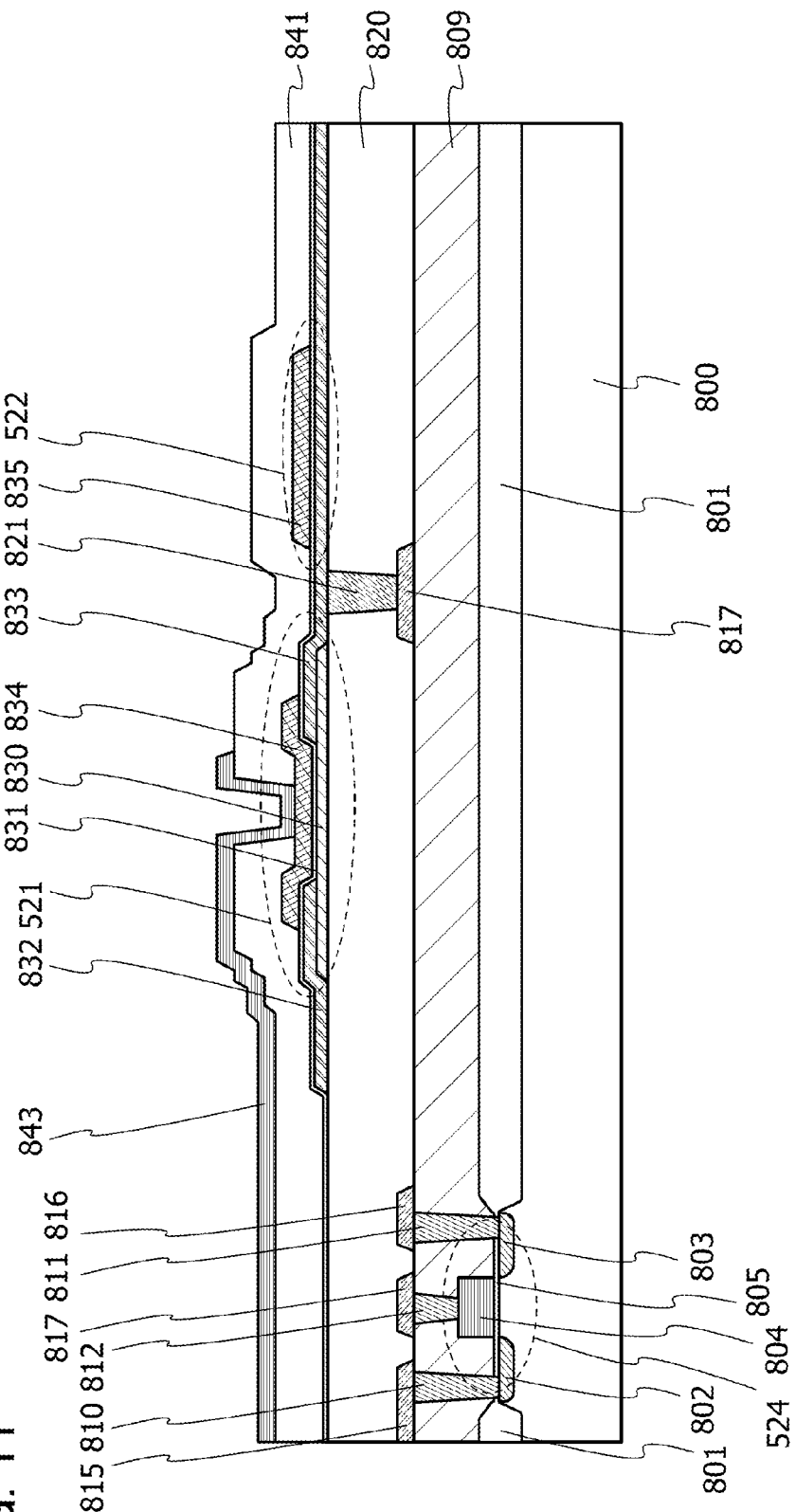
FIG. 11 illustrates a cross-sectional structure of a circuit portion.

FIG. 11 illustrates an example of part of a cross-sectional structure of a circuit portion according to one embodiment of the disclosed invention. Note that FIG. 11 illustrates the transistor 524, the capacitor 522, and the transistor 521 in FIG. 6 in Embodiment 2.

In this embodiment, the transistor 524 is formed in a single crystal silicon substrate, and the transistor 521 including an active layer containing an oxide semiconductor is formed above the transistor 524. The transistor 524 may include a semiconductor thin film of silicon, germanium, or the like in an amorphous, microcrystalline, polycrystalline, or single crystal state as an active layer. Alternatively, the transistor 524 may include an active layer containing an oxide semiconductor. In the case where the transistors each include an active layer containing an oxide semiconductor, the transistor 521 is not necessarily stacked above the transistor 524, and the transistors 521 and 524 may be formed in the same layer.

In the case where the transistor 524 is formed using a thin silicon film, any of the following can be used: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

Note that in the case where, among transistors in FIG. 6 in Embodiment 2, the transistor 521 contains an oxide semiconductor and the transistors 523 and 524 contain silicon, the number of transistors containing an oxide semiconductor is smaller than that of transistors containing silicon. As a result, the design rule of the transistor 521 can be relaxed by stacking the transistor 521 over a transistor containing silicon.

The chip area of a PLD can be reduced with the use of such a register in which a transistor containing silicon and a transistor containing an oxide semiconductor are stacked. Since the number of transistors containing silicon is larger than that of transistors containing an oxide semiconductor in one circuit block, the actual chip area of the PLD depends on the number of transistors containing silicon.

In FIG. 11, the n-channel transistor 524 is formed in a semiconductor substrate 800.

The semiconductor substrate 800 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate). In FIG. 11, a single crystal silicon substrate having n-type conductivity is used.

The transistor 524 is electrically isolated from another transistor by an element isolation insulating film 801. The element isolation insulating film 801 can be formed by a local oxidation of silicon (LOCOS) method, a trench isolation method, or the like.

Specifically, the transistor 524 includes impurity regions 802 and 803 that are formed in the semiconductor substrate 800 and function as a source region and a drain region, a gate electrode 804, and a gate insulating film 805 provided between the semiconductor substrate 800 and the gate electrode 804. The gate electrode 804 overlaps with a channel formation region formed between the impurity regions 802 and 803 with the gate insulating film 805 positioned between the gate electrode 804 and the channel formation region.

An insulating film 809 is provided over the transistor 524. Openings are formed in the insulating film 809. Wirings 810 and 811 that are in contact with the impurity regions 802 and 803, respectively, and a wiring 812 that is in contact with the gate electrode 804 is formed in the openings.

The wiring 810 is connected to a wiring 815 formed over the insulating film 809. The wiring 811 is connected to a wiring 816 formed over the insulating film 809. The wiring 812 is connected to a wiring 817 formed over the insulating film 809.

An insulating film 820 is formed over the wirings 815 to 817. An opening is formed in the insulating film 820. In the opening, a wiring 821 that is connected to the wiring 817 is formed.

In FIG. 11, the transistor 521 and the capacitor 522 are formed over the insulating film 820.

The transistor 521 includes, over the insulating film 820, a semiconductor film 830 containing an oxide semiconductor, conductive films 832 and 833 that are positioned over the semiconductor film 830 and function as a source electrode and a drain electrode, a gate insulating film 831 over the semiconductor film 830 and the conductive films 832 and 833, and a gate electrode 834 that is positioned over the gate insulating film 831 and overlaps with the semiconductor film 830 between the conductive films 832 and 833. Note that the conductive film 833 is connected to the wiring 821.

A conductive film 835 is provided over the gate insulating film 831 to overlap with the conductive film 833. A portion where the conductive films 833 and 835 overlap with each other with the gate insulating film 831 positioned therebetween functions as the capacitor 522.

Note that in FIG. 11, the capacitor 522 is provided over the insulating film 820 together with the transistor 521. However, the capacitor 522 may be provided below the insulating film 820 together with the transistor 521.

An insulating film 841 is provided over the transistor 521 and the capacitor 522. An opening is provided in the insulating film 841. Over the insulating film 841, a conductive film 843 that is in contact with the gate electrode 834 through the opening is provided.

Note that in FIG. 11, the transistor 521 includes the gate electrode 834 on at least one side of the semiconductor film 830. Alternatively, the transistor 521 may include a pair of gate electrodes with the semiconductor film 830 positioned therebetween.

When the transistor 521 includes a pair of gate electrodes with the semiconductor film 830 positioned therebetween, a signal for controlling an on state or an off state may be supplied to one of the gate electrodes, and the other of the gate electrodes may be supplied with a potential from another element. In the latter case, potentials at the same level may be supplied to the pair of gate electrodes, or a fixed potential such as a ground potential may be supplied only to the other of the gate electrodes. By controlling the level of a potential applied to the other of the gate electrodes, the threshold voltage of the transistor 521 can be controlled.

The semiconductor film 830 is not necessarily formed using a single oxide semiconductor film, and may be formed using a stack of a plurality of oxide semiconductor layers. For example, FIG. 12A illustrates a structure example of the transistor 521 in which the semiconductor film 830 has a three-layer structure.

Figure 12A:
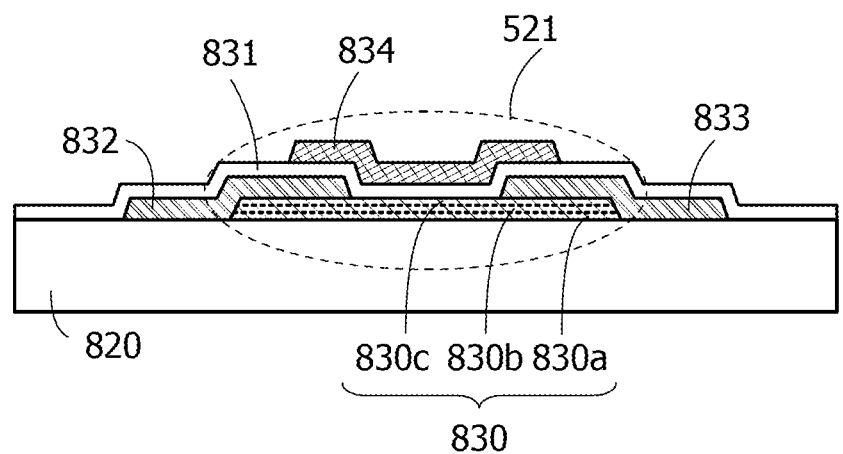
FIGS. 12A and 12B each illustrate a cross section of a semiconductor device.

A transistor 521 in FIG. 12A includes a semiconductor film 830 provided over an insulating film 820 and the like, conductive films 832 and 833 electrically connected to the semiconductor film 830, a gate insulating film 831, and a gate electrode 834 that is provided over the gate insulating film 831 to overlap with the semiconductor film 830.

In the transistor 521, oxide semiconductor layers 830a to 830c are stacked sequentially from the insulating film 820 side as the semiconductor film 830.

Each of the oxide semiconductor layers 830a and 830c is an oxide layer that contains at least one of metal elements contained in the oxide semiconductor layer 830b and in which energy at the bottom of the conduction band is closer to the vacuum level than that in the oxide semiconductor layer 830b by higher than or equal to 0.05 eV, 0.07 eV, 0.1 eV, or 0.15 eV and lower than or equal to 2 eV, 1 eV, 0.5 eV, or 0.4 eV. The oxide semiconductor layer 830b preferably contains at least indium because carrier mobility is increased.

Figure 12B:
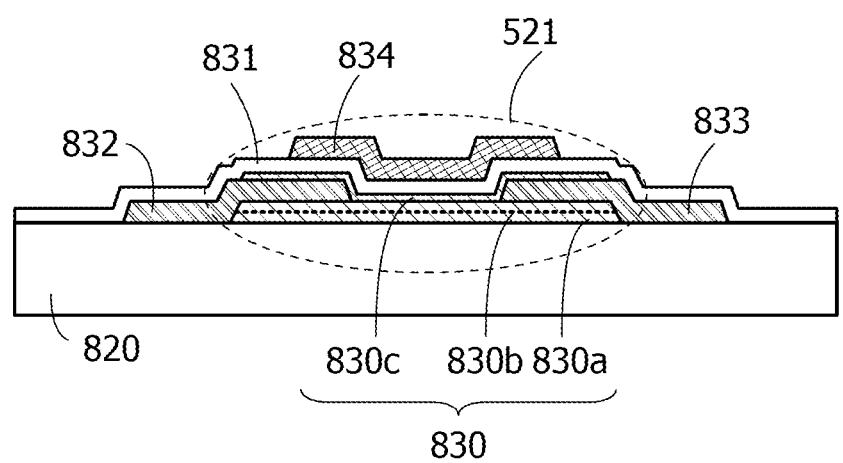

Note that as illustrated in FIG. 12B, the oxide semiconductor layer 830c may be provided over the conductive films 832 and 833 to overlap with the gate insulating film 831.

This embodiment can be combined with any of the other embodiments as appropriate.

Embodiment 5

In this embodiment, examples in which a circuit portion including the PLD described in the above embodiment is used in an electronic component and examples in which a circuit including the PLD described in the above embodiment is used in an electronic device including the electronic component are described with reference to FIGS. 13A and 13B and FIGS. 14A to 14E.

Figure 13A:
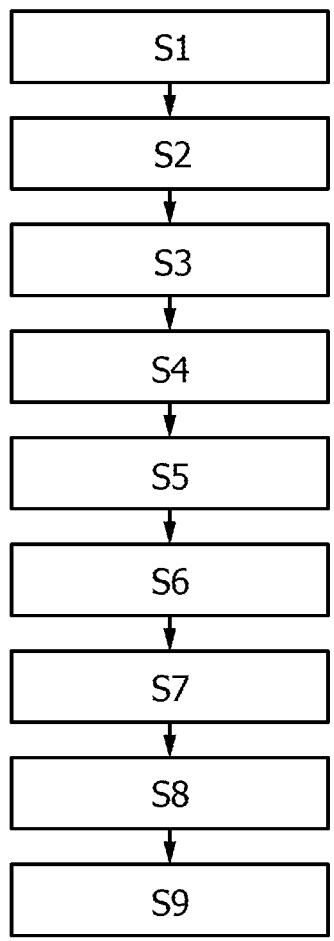
FIG. 13A is a flow chart showing steps of manufacturing a semiconductor device.

FIG. 13A illustrates an example in which a chip including a circuit portion including the PLD described in the above embodiment is used in an electronic component. Note that the electronic component is also referred to as a semiconductor package or an IC package. This electronic component has a plurality of standards and names depending on a terminal extraction direction and a terminal shape. Thus, examples of the electronic component are described in this embodiment.

A circuit portion including a transistor as illustrated in FIG. 11 in Embodiment 4 can be completed after an assembly process (post-process) by using a plurality of components that can be detached and attached from and to a printed wiring board in combination.

The post-process can be finished through each step in FIG. 13A. Specifically, after an element substrate obtained in the preceding process is completed (Step S1), a rear surface of the substrate is ground (Step S2). By thinning the substrate at this stage, the warpage or the like of the substrate in the preceding process is reduced and the component is downsized.

The rear surface of the substrate is ground so that the substrate is divided into a plurality of chips in a dicing process. Then, the divided chips are separately picked up to be mounted on and bonded to a lead frame in a die bonding process (Step S3). In this die bonding process, the chip is bonded to the lead frame by an appropriate method depending on a product, for example, bonding with a resin or a tape. Note that in the die bonding process, bonding between the chip and the lead frame may be conducted by mounting the chip on an interposer.

Then, wire bonding is performed to electrically connect lead of the lead frame to an electrode on the chip with a metal fine line (wire) (Step S4). A silver line or a gold line can be used as the metal fine line. Ball bonding or wedge bonding can be used as the wire bonding.

A molding process is performed to seal the wire bonded chip with an epoxy resin or the like (Step S5). With the molding process, the electronic component is filled with the resin, so that a mounted circuit portion or wire can be protected against mechanical external force. Furthermore, deterioration in characteristics due to moisture or dust can be reduced.

Next, plate processing is performed on the lead of the lead frame. After that, the lead is cut and processed (Step S6). This plate processing prevents rust of the lead and facilitates soldering at the time of mounting the electronic component on a printed wiring board in a later step.

Then, printing (marking) is performed on a surface of the package (Step S7). Through the final inspection process (Step S8), the electronic component that includes a circuit portion including the PLD is completed (Step S9).

The above electronic component can include a circuit portion including the PLD described in the above embodiment. Thus, it is possible to obtain a sophisticated low-power electronic component.

Figure 13B:
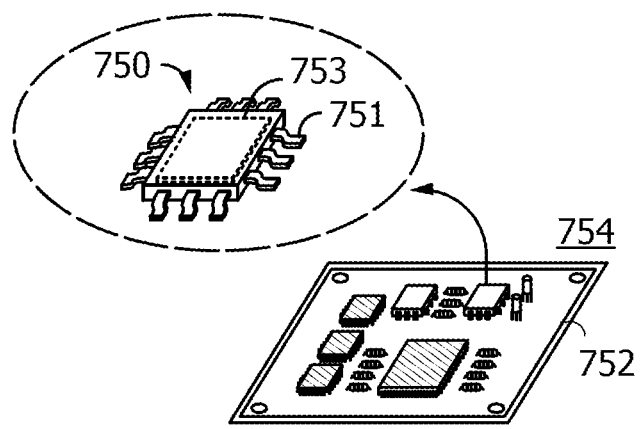
FIG. 13B is a schematic perspective view of a completed electronic component.

FIG. 13B is a schematic perspective view of the completed electronic component. FIG. 13B illustrates a schematic perspective view of a quad flat package (QFP) as an example of the electronic component. A lead 751 and a circuit portion 753 of an electronic component 750 are illustrated in FIG. 13B. The electronic component 750 in FIG. 13B is mounted on a printed circuit board 752, for example. When the plurality of electronic components 750 are used in combination and electrically connected to each other over the printed circuit board 752, a semiconductor device is completed. The completed semiconductor device is provided in an electronic device or the like.

Then, applications of the electronic component to an electronic device such as a computer, a portable information terminal (including a cellular phone, a portable game machine, an audio reproducing device, and the like), electronic paper, a television device (also referred to as a television or a television receiver), or a digital video camera are described.

Figure 14A:
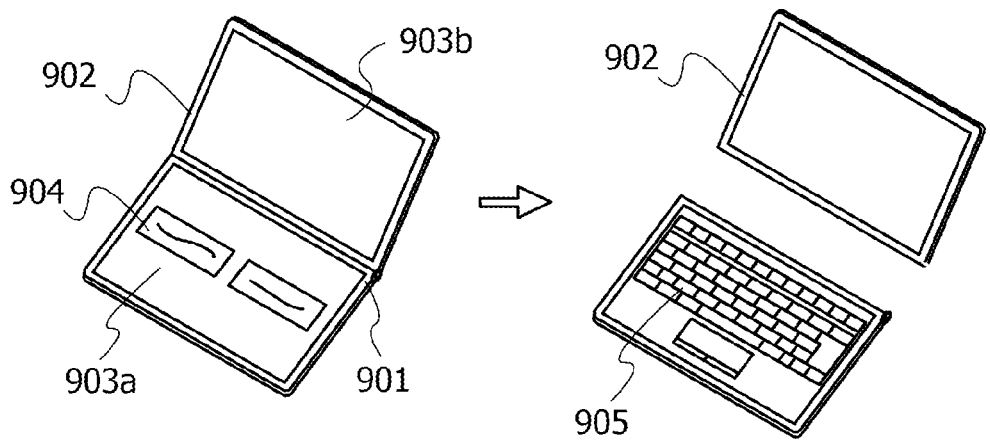
FIGS. 14A to 14E each illustrate an electronic device including a semiconductor device.

FIG. 14A illustrates a portable information terminal, which includes a housing 901, a housing 902, a first display portion 903a, a second display portion 903b, and the like. A semiconductor device including the PLD described in the above embodiment is provided in at least one of the housings 901 and 902. Thus, a sophisticated low-power portable information terminal is obtained.

Note that the first display portion 903a is a touch panel, and for example, as illustrated in the left of FIG. 14A, which of "touch input" and "keyboard input" is performed can be selected by a selection button 904 displayed on the first display portion 903a. Since the selection buttons with a variety of sizes can be displayed, the portable information terminal can be easily used by people of any generation. In the case where "keyboard input" is selected, for example, a keyboard 905 is displayed on the first display portion 903a as illustrated in the right of FIG. 14A. With the keyboard 905, letters can be input quickly by keyboard input as in the case of using a conventional information terminal, for example.

Furthermore, one of the first display portion 903a and the second display portion 903b can be detached from the portable information terminal as illustrated in the right in FIG. 14A. The second display portion 903b can also function as a touch panel for a reduction in weight to carry around to be operated by one hand while the other hand supports the housing 902, which is convenient.

The portable information terminal in FIG. 14A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (e.g., an earphone terminal or a USB terminal), a recording medium insertion portion, and the like may be provided on the rear surface or the side surface of the housing.

The portable information terminal in FIG. 14A may transmit and receive data wirelessly. Through wireless communication, desired book data or the like can be purchased and downloaded from an electronic book server.

Furthermore, the housing 902 in FIG. 14A may have an antenna, a microphone function, or a wireless communication function to be used as a cellular phone.

Figure 14B:
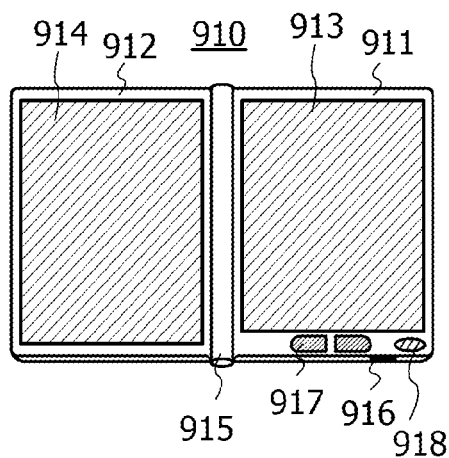

FIG. 14B illustrates an e-book reader 910 including electronic paper. The e-book reader 910 includes two housings 911 and 912. The housing 911 and the housing 912 include a display portion 913 and a display portion 914, respectively. The housings 911 and 912 are connected to each other by a hinge 915, so that the e-book reader 910 can be opened and closed using the hinge 915 as an axis. The housing 911 includes a power button 916, operation keys 917, a speaker 918, and the like. A semiconductor device including the PLD described in the above embodiment is provided in at least one of the housings 911 and 912. Thus, a sophisticated low-power-book reader is obtained.

Figure 14C:
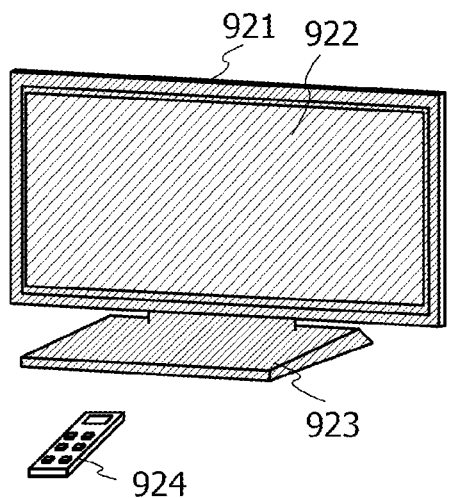

FIG. 14C is a television device, which includes a housing 921, a display portion 922, a stand 923, and the like. The television device can be operated with a switch of the housing 921 and a remote control 924. A semiconductor device including the PLD described in the above embodiment is provided in the housing 921 and the remote control 924. Thus, a sophisticated low-power television device is obtained.

Figure 14D:
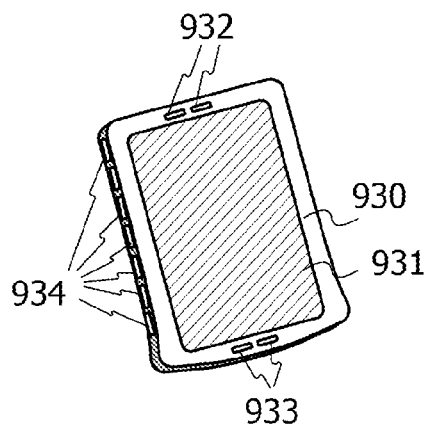

FIG. 14D illustrates a smartphone in which a main body 930 includes a display portion 931, a speaker 932, a microphone 933, operation buttons 934, and the like. A semiconductor device including the PLD described in the above embodiment is provided in the main body 930. Thus, a sophisticated low-power smartphone is obtained.

Figure 14E:
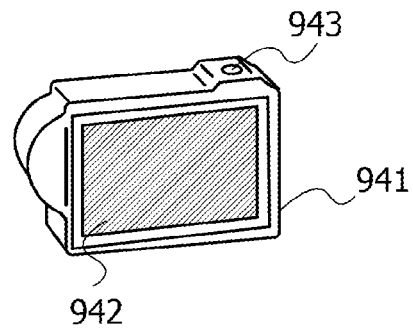

FIG. 14E illustrates a digital camera, which includes a main body 941, a display portion 942, an operation switch 943, and the like. A semiconductor device including the PLD described in the above embodiment is provided in the main body 941. Thus, a sophisticated low-power digital camera is obtained.

As described above, a board on which an electronic component including the semiconductor device including the PLD described in the above embodiment is provided is mounted on each of the electronic devices described in this embodiment. Thus, a sophisticated low-power electronic device is obtained.

Example

This example shows output signal waveforms of a sophisticated low-power semiconductor device including the PLD in the above embodiment that is obtained by manufacturing a chip of the semiconductor device at the time when context signals are switched or data is backed up or recovered.

Figure 15:
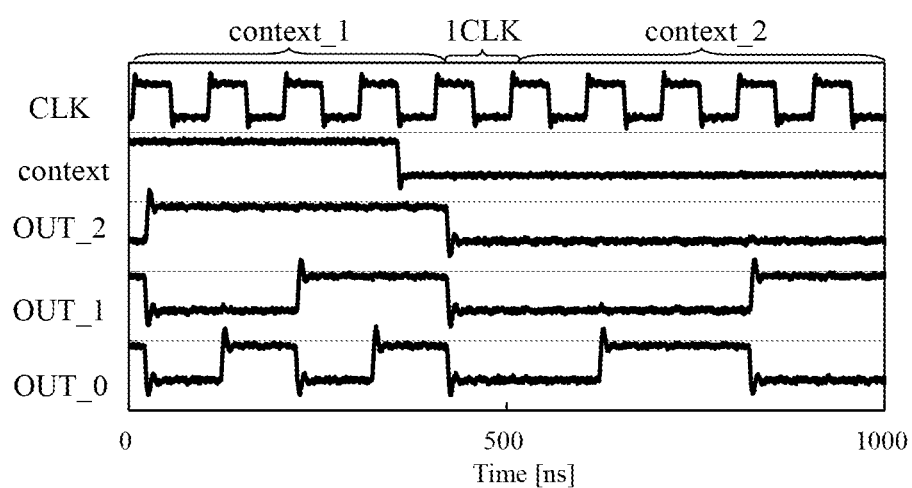
FIG. 15 shows waveforms of signals output from a configuration memory.

FIG. 15 shows output signal waveforms of a circuit outputting an input signal in response to a context signal and the function of a semiconductor device including the PLD in FIG. 2. FIG. 15 shows a context signal (Context) for context switch, a clock signal (CLK) as an input signal, and "OUT_0" to "OUT_2" as output signals.

In FIG. 15, for example, a context signal switches a first context (Context_1) (corresponding to a function of outputting a clock signal as a ½ frequency division signal) and a second context (Context_2) (corresponding to a function of outputting a clock signal as a ¼ frequency division signal). In the timing chart of FIG. 15, power supply voltage is 2.5 V and the drive frequency of the clock signal is 10 MHz.

Note that the output signals "OUT_0" to "OUT_2" in FIG. 15 are obtained from terminals for outputting output signals of the programmable logic elements "LE_00" to "LE_02" of the input/output terminal portion 114L in the PLD in FIG. 2. In other words, the function of the PLD is changed by switching context signals, so that the output signals "OUT_0" to "OUT_2" are switched.

By switching context signals as illustrated in FIG. 15, the function is changed from the first context to the second context after one clock (1CLK) switching period, and the output signals can be switched.

Figure 16:
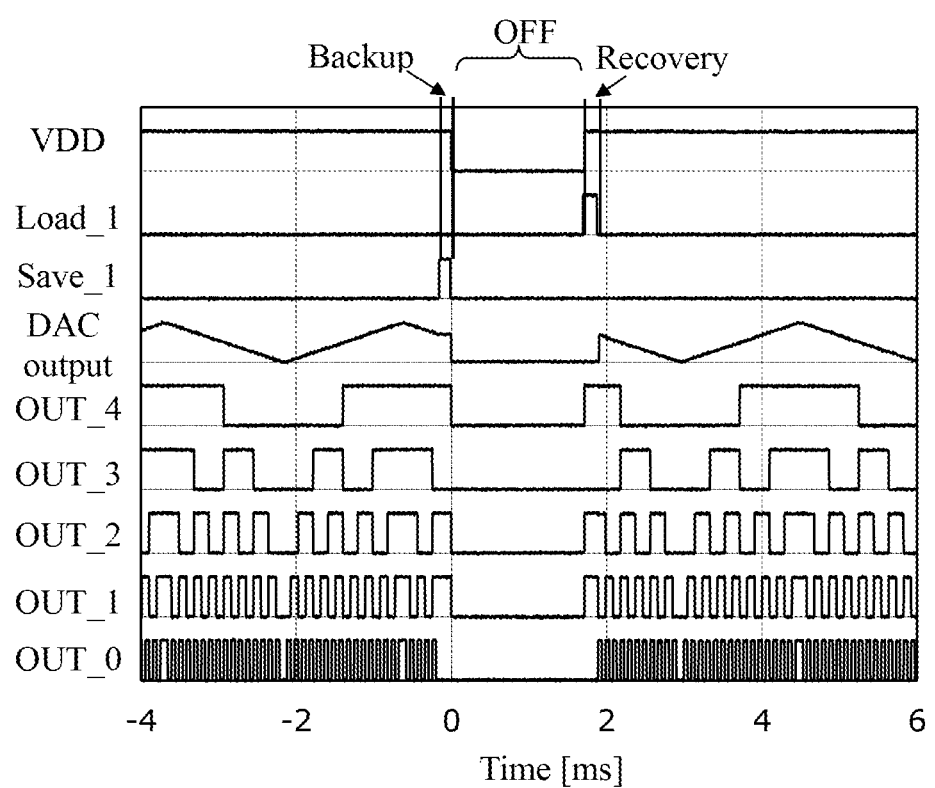
FIG. 16 shows waveforms of signals output from a configuration memory.

Next, FIG. 16 shows output signal waveforms of a circuit at the time when data is backed up in the semiconductor device including the PLD in FIG. 2, power supply is stopped, and then, the power supply is restarted and the data is recovered. In FIG. 16, a signal VDD is at an H level in a power supply period, and the signal VDD is at an L level in a power supply stop period (OFF). Furthermore, in FIG. 16, a first control signal (Save_1) is at an H level in a data backup period (Backup), and a second control signal (Load_1) is at an H level in a data recovery period (Recovery).

In addition, FIG. 16 shows output signal waveforms of a semiconductor device including a PLD whose function is changed to a counter circuit by context switch in which stepping up and stepping down are repeated. In FIG. 16, a first control signal, a second control signal, an output signal (DAC output) of a digital/analog converter as an input signal, and "OUT_0" to "OUT_4" as output signals are shown.

Note that the output signals "OUT_0" to "OUT_4" in FIG. 16 are obtained from terminals for outputting output signals of the programmable logic elements "LE_00" to "LE_04" of the input/output terminal portion 114L in the PLD in FIG. 2. In the timing chart of FIG. 16, power supply voltage is 2.5 V and the drive frequency of a clock signal is 16 kHz.

As shown in FIG. 16, after data is backed up, power supply is stopped, the power supply is restarted, and the data can be recovered correctly. In addition, before and after the power supply is stopped, the semiconductor device including the PLD can maintain the function as a counter circuit in which stepping up and stepping down are repeated, and can have non volatility of configuration data stored in a configuration memory.

Figure 17:
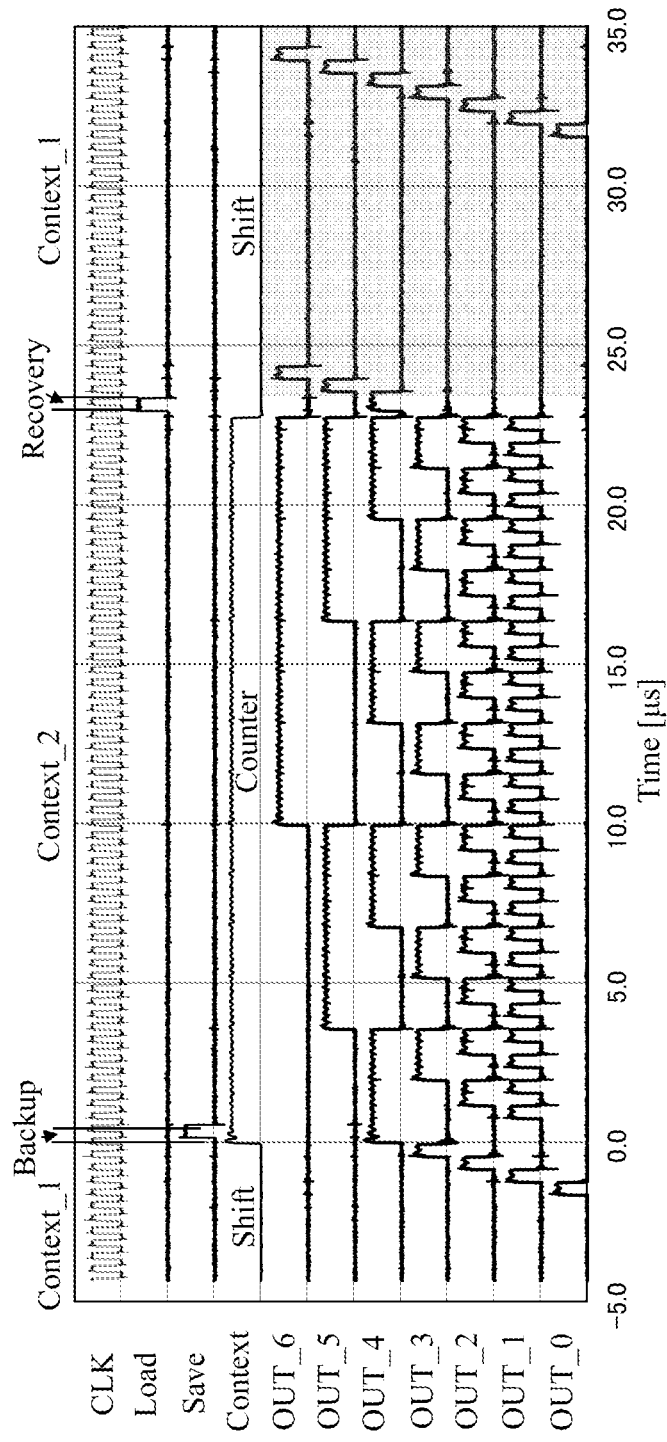
FIG. 17 shows waveforms of signals output from a register.

Next, FIG. 17 shows output signal waveforms of a circuit at the time when data is backed up and recovered in the semiconductor device including the PLD in FIG. 2 before and after context switch with a context signal and power gating is performed on an unused programmable logic element. In FIG. 17, the first control signal (Save_1) is at an H level in the data backup period (Backup), and the second control signal (Load_1) is at an H level in the data recovery period (Recovery). FIG. 17 shows the context signal (Context) for context switch, the clock signal (CLK) as an input signal, and "OUT_0" to "OUT_6" as output signals.

In FIG. 17, for example, a context signal switches the first context (Context_1) (corresponding to a function of a shift circuit) and the second context (Context_2) (corresponding to a function of a counter circuit). In the timing chart of FIG. 17, power supply voltage is 2.5 V and the drive frequency of the clock signal is 2.5 MHz.

Note that in FIG. 17, "OUT_0" to "OUT_6" are used as output signals of the shift circuit in the first context, and "OUT_1" to "OUT_6" are used as output signals of the counter circuit in the second context. In other words, in the second context, the output signal "OUT_0" is not used and power gating is performed on the programmable logic element LE_00.

Note that the output signals "OUT_0" to "OUT_6" in FIG. 17 are obtained from terminals for outputting output signals of the programmable logic elements "LE_00" to "LE_06" of the input/output terminal portion 114L in the PLD in FIG. 2. In other words, the function of the PLD is changed by switching context signals, so that the output signals "OUT_0" to "OUT_6" are switched.

As shown in FIG. 17, by switching context signals, the circuit is changed from the shift circuit to the counter circuit, and the circuit is changed from the counter circuit to the shift circuit. It can be seen that before and after data backup, the output signal waveforms of the shift circuit are connected to waveforms that are counted up in the counter circuit. In addition, before and after data recovery, data that has been backed up in the previous period is recovered without being affected by the output signal waveforms of the counter circuit, and output signal waveforms at the time when the circuit functions as the shift circuit again can be seen.

Next, the power reduction effect in the semiconductor device including the PLD in FIG. 2 was verified. Changes in power consumption with or without power gating at the time when supply of power to the semiconductor device including the PLD in FIG. 2 is stopped and when the supply of power to the semiconductor device including the PLD in FIG. 2 is restarted were measured.

Note that power consumption was measured under power gating conditions of a power supply voltage of 2.5 V and a drive frequency of a clock signal of 10 MHz. The power consumption of a programmable logic device was estimated from the proportion of power consumption of each circuit portion to the total power consumption of the semiconductor device that is estimated by SPICE simulation under the same conditions.

As a result, the power consumption of one programmable logic device with power gating was 0.06 μW, and the power consumption of one programmable logic device without power gating was 15.72 μW. Thus, power gating was able to reduce power consumption by 15.66 μW (99.6%).

Figure 18A:
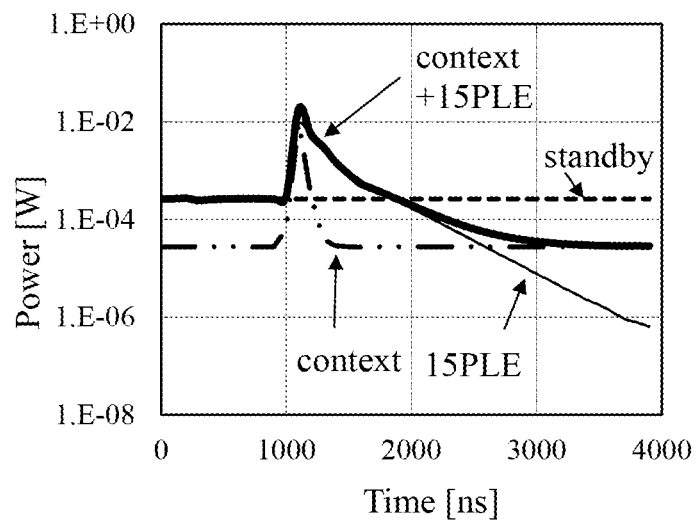
FIGS. 18A and 18B are graphs each showing comparison results of power consumption.

Next, FIG. 18A is a graph showing changes in power consumption with or without power gating at the time when power supply is stopped. In addition, FIG. 18B is a graph showing changes in power consumption with or without power gating at the time when the power supply is restarted.

Note that the power consumption of the semiconductor device including the PLD in FIG. 2 was measured. In the measurement, five programmable logic elements formed a shift register, and the other 15 programmable logic elements were subjected to power gating or not subjected to power gating.

Note that "context" in FIG. 18A represents a change in power required for context switch at the time when power supply is stopped by power gating. In addition, "15PLE" in FIG. 18A represents a change in power required for the 15 programmable logic elements subjected to power gating at the time when the power supply is stopped by power gating. Furthermore, "context+15PLE" in FIG. 18A represents a change in power required for context switch and the 15 programmable logic devices subjected to power gating at the time when the power supply is stopped by power gating. Furthermore, "standby" in FIG. 18A represents a change in power at the time when the programmable logic elements are not subjected to power gating by context switch.

Figure 18B:
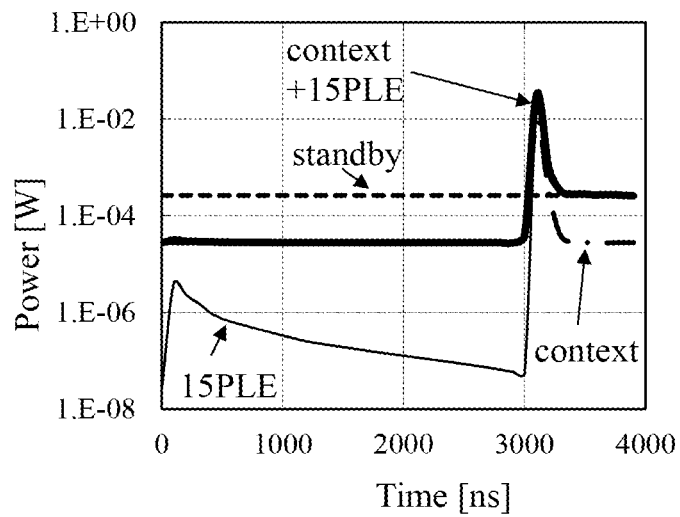

In addition, "context" in FIG. 18B represents a change in power required for context switch at the time when the power supply is restarted by power gating. In addition, "15PLE" in FIG. 18B represents a change in power required for the 15 programmable logic elements subjected to power gating at the time when the power supply is restarted by power gating. Furthermore, "context+15PLE" in FIG. 18B represents a change in power required for context switch and the 15 programmable logic devices subjected to power gating at the time when the power supply is restarted by power gating. Furthermore, "standby" in FIG. 18B represents a change in power at the time when the programmable logic elements are not subjected to power gating by context switch.

To check differences in power overhead with or without power gating, differences in power consumption with or without power gating were estimated by SPICE simulation.

Here, the power overhead includes power required to control context signals and to control a switch PSW. As a result, the time to stop/restart the power supply by context switch was 90 ns/700 ns, and power overhead at the time of stopping/restarting the power supply was 2.80 nJ/3.36 nJ. Specifically, the power required to control context signals was 0.98 nJ/0.99 nJ, and the power required to control the switch PSW was 1.82 nJ/2.37 nJ. Break-even time when the power overhead corresponds to standby power was 23.3 μs. From the above results, if the number of programmable logic elements subjected to power gating was 1, 5, or 10, the break-even time was estimated to be 51.8 μs, 31.5 μs, or 25.6 μs. As the number of programmable logic elements subjected to power gating becomes larger, the proportion of the power required to control context signals in the power overhead can be lowered; thus, the break-even time becomes shorter.

Finally, data transfer between a volatile storage circuit and a nonvolatile storage circuit was verified. As a result, it took 200 ns to back up data, and it took 20 ns to recover the data. In addition, from the verification results in FIG. 16, a period required for context switch was shorter than or equal to 50 ns. Thus, circuit switch between different contexts and data backup and recovery were able to be performed at high speed.

This application is based on Japanese Patent Application serial No. 2013-127859 filed with Japan Patent Office on Jun. 18, 2013, the entire contents of which are hereby incorporated by reference.

What is claimed is:

1. A semiconductor device comprising:
a programmable logic element comprising a register,
wherein a function of the programmable logic element is determined in accordance with a context,
wherein the register comprises a volatile storage circuit and a nonvolatile storage circuit,
wherein the nonvolatile storage circuit comprises a first nonvolatile storage portion and a second nonvolatile storage portion, and
wherein the register is configured to back up data of the volatile storage circuit to the first nonvolatile storage portion when a context is switched from a first context to a second context.

2. The semiconductor device according to claim 1, wherein the register is configured to recover data of the first nonvolatile storage portion to the volatile storage circuit when a context is switched from the second context to the first context.

3. The semiconductor device according to claim 1, wherein power supply to the programmable logic element is performed when a context is the first context, and
wherein the power supply to the programmable logic element is not performed when a context is the second context.

4. The semiconductor device according to claim 1, wherein the register is configured to recover data of the first nonvolatile storage portion to the volatile storage circuit when a context is switched from the second context to the first context,
wherein power supply to the programmable logic element is performed when a context is the first context, and
wherein the power supply to the programmable logic element is not performed when a context is the second context.

5. The semiconductor device according to claim 1, wherein the programmable logic element comprises a first configuration memory configured to store first configuration data corresponding to the first context,
wherein the programmable logic element comprises a second configuration memory configured to store second configuration data corresponding to the second context,
wherein power supply to the programmable logic element is controlled in accordance with the first configuration data, and
wherein the power supply to the programmable logic element is controlled in accordance with the second configuration data.

6. The semiconductor device according to claim 1, wherein the programmable logic element comprises a first configuration memory configured to store first configuration data corresponding to the first context,
wherein the programmable logic element comprises a second configuration memory configured to store second configuration data corresponding to the second context, wherein power supply to the programmable logic element is controlled in accordance with the first configuration data, wherein the power supply to the programmable logic element is controlled in accordance with the second configuration data, wherein the register is configured to recover data of the first nonvolatile storage portion to the volatile storage circuit when a context is switched from the second context to the first context, wherein the power supply to the programmable logic element is performed when a context is the first context, and wherein the power supply to the programmable logic element is not performed when a context is the second context.

7. The semiconductor device according to claim 1, wherein the first nonvolatile storage portion comprises a transistor comprising a channel formation region comprising an oxide semiconductor.

8. A semiconductor device comprising:

a programmable logic element comprising a register, wherein a function of the programmable logic element is determined in accordance with a context, wherein the register comprises a volatile storage circuit and a nonvolatile storage circuit, wherein the nonvolatile storage circuit comprises a first nonvolatile storage portion to a k-th nonvolatile storage portion, where k is a natural number of 2 or more, and wherein the register is configured to back up data of the volatile storage circuit to the first nonvolatile storage portion when a context is switched from a first context to a second context.

9. The semiconductor device according to claim 8, wherein the register is configured to recover data of the first nonvolatile storage portion to the volatile storage circuit when a context is switched from the second context to the first context.

10. The semiconductor device according to claim 8, wherein power supply to the programmable logic element is performed when a context is the first context, and wherein the power supply to the programmable logic element is not performed when a context is the second context.

11. The semiconductor device according to claim 8, wherein the register is configured to recover data of the first nonvolatile storage portion to the volatile storage circuit when a context is switched from the second context to the first context, wherein power supply to the programmable logic element is performed when a context is the first context, and wherein the power supply to the programmable logic element is not performed when a context is the second context.

12. The semiconductor device according to claim 8, wherein the programmable logic element comprises a first configuration memory configured to store first configuration data corresponding to the first context, wherein the programmable logic element comprises a second configuration memory configured to store second configuration data corresponding to the second context, wherein power supply to the programmable logic element is controlled in accordance with the first configuration data, and wherein the power supply to the programmable logic element is controlled in accordance with the second configuration data.

13. The semiconductor device according to claim 8, wherein the programmable logic element comprises a first configuration memory configured to store first configuration data corresponding to the first context, wherein the programmable logic element comprises a second configuration memory configured to store second configuration data corresponding to the second context, wherein power supply to the programmable logic element is controlled in accordance with the first configuration data, wherein the power supply to the programmable logic element is controlled in accordance with the second configuration data, wherein the register is configured to recover data of the first nonvolatile storage portion to the volatile storage circuit when a context is switched from the second context to the first context, wherein the power supply to the programmable logic element is performed when a context is the first context, and wherein the power supply to the programmable logic element is not performed when a context is the second context.

14. The semiconductor device according to claim 8, wherein the first nonvolatile storage portion comprises a transistor comprising a channel formation region comprising an oxide semiconductor.

15. A semiconductor device comprising:

a plurality of programmable logic elements, each of the plurality of programmable logic elements comprising a register, wherein a function of each of the plurality of the programmable logic elements is determined in accordance with a context, wherein the register comprises a volatile storage circuit and a nonvolatile storage circuit, wherein the nonvolatile storage circuit comprises a first nonvolatile storage portion to a k-th nonvolatile storage portion, where k is a natural number of 2 or more, and wherein the register is configured to back up data of the volatile storage circuit to the first nonvolatile storage portion when a context is switched from a first context to a second context.

16. The semiconductor device according to claim 15, wherein the register is configured to recover data of the first nonvolatile storage portion to the volatile storage circuit when a context is switched from the second context to the first context.

17. The semiconductor device according to claim 15, wherein power supply to one of the plurality of the programmable logic elements is performed when a context is the first context, and wherein the power supply to the one of the plurality of the programmable logic elements is not performed when a context is the second context.

18. The semiconductor device according to claim 15, wherein the register is configured to recover data of the first nonvolatile storage portion to the volatile storage circuit when a context is switched from the second context to the first context, wherein power supply to one of the plurality of the programmable logic elements is performed when a context is the first context, and wherein the power supply to the one of the plurality of the programmable logic elements is not performed when a context is the second context.

19. The semiconductor device according to claim 15,
wherein each of the plurality of the programmable logic elements comprises a first configuration memory configured to store first configuration data corresponding to the first context,
wherein each of the plurality of the programmable logic elements comprises a second configuration memory configured to store second configuration data corresponding to the second context,
wherein power supply to one of the plurality of the programmable logic elements is controlled in accordance with the first configuration data, and
wherein the power supply to the one of the plurality of the programmable logic elements is controlled in accordance with the second configuration data.

20. The semiconductor device according to claim 15,
wherein each of the plurality of the programmable logic elements comprises a first configuration memory configured to store first configuration data corresponding to the first context,
wherein each of the plurality of the programmable logic elements comprises a second configuration memory configured to store second configuration data corresponding to the second context,
wherein power supply to one of the plurality of the programmable logic elements is controlled in accordance with the first configuration data,
wherein the power supply to the one of the plurality of the programmable logic elements is controlled in accordance with the second configuration data,
wherein the register is configured to recover data of the first nonvolatile storage portion to the volatile storage circuit when a context is switched from the second context to the first context,
wherein the power supply to the one of the plurality of the programmable logic elements is performed when a context is the first context, and
wherein the power supply to the one of the plurality of the programmable logic elements is not performed when a context is the second context.

* * * * *